United States Patent
Fitzgerald et al.

(10) Patent No.: US 12,099,085 B2
(45) Date of Patent: Sep. 24, 2024

(54) APPARATUSES AND METHODS FOR TESTING SEMICONDUCTOR CIRCUITRY USING MICROELECTROMECHANICAL SYSTEMS SWITCHES

(71) Applicant: Analog Devices International Unlimited Company, Limerick (IE)

(72) Inventors: Padraig Fitzgerald, Mallow (IE); Erkan Acar, Melrose, MA (US); Patrick M. McGuinness, Limerick (IE); Randy Oltman, Andover, MA (US); Naveen Dhull, Limerick (IE); Derek W. Nolan, Tralee (IE); Eric James Carty, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 174 days.

(21) Appl. No.: 17/746,498

(22) Filed: May 17, 2022

(65) Prior Publication Data

US 2022/0373592 A1 Nov. 24, 2022

Related U.S. Application Data

(60) Provisional application No. 63/190,203, filed on May 18, 2021.

(51) Int. Cl.
 *G01R 31/28* (2006.01)
 *H01H 1/00* (2006.01)

(52) U.S. Cl.
 CPC ....... *G01R 31/2834* (2013.01); *H01H 1/0036* (2013.01)

(58) Field of Classification Search
 CPC ............ G01R 31/2834; G01R 1/07385; H01H 1/0036
 See application file for complete search history.

(56) References Cited

U.S. PATENT DOCUMENTS 6,331,783 B1   12/2001   Hauptman
7,378,835 B2   5/2008   Reimund et al.
(Continued)

FOREIGN PATENT DOCUMENTS

CN    112863589 A    5/2021
JP    4853395 B2     1/2012
(Continued)

OTHER PUBLICATIONS

Carty, How the ADGM1304 and ADGM1004 Increase Test Instrumentation Channel Density and Test Functionality. Analog Devices. AN-1360 Application Note. Mar. 2008, 7 pages.
(Continued)

*Primary Examiner* — Thang X Le
*Assistant Examiner* — Haidong Zhang
(74) *Attorney, Agent, or Firm* — Wolf, Greenfield & Sacks, P.C.

(57) ABSTRACT

An apparatus is provided that is implemented to enable multiple tests of different types, such as a direct current (DC) test and/or a radio frequency (RF) test of a semiconductor device. The apparatus includes a microelectromechanical systems (MEMS) switch block coupled between the semiconductor device and automatic testing equipment (ATE). The apparatus is configured to enable/disable a DC path or an RF path to switch between a DC test and an RF test without reconfiguring the connections between the semiconductor device and the ATE. The DC path is used to perform a DC contact test for one or more pins of the semiconductor device. The RF path is used to perform an RF test for the semiconductor device.

19 Claims, 22 Drawing Sheets

(56) References Cited

U.S. PATENT DOCUMENTS

| | | | |
|---|---|---|---|
| 7,737,810 | B2 | 6/2010 | Chan et al. |
| 7,924,035 | B2* | 4/2011 | Huebner .......... G01R 31/31926 |
| | | | 324/754.01 |
| 8,035,148 | B2 | 10/2011 | Goldstein |
| 8,138,778 | B1 | 3/2012 | Smith |
| 8,581,612 | B2 | 11/2013 | Horii et al. |
| 8,774,729 | B2 | 7/2014 | Olgaard et al. |
| 8,872,534 | B2 | 10/2014 | Berry et al. |
| 8,995,926 | B2* | 3/2015 | Mow ................. H04B 17/345 |
| | | | 455/67.14 |
| 9,244,118 | B2 | 1/2016 | Chen et al. |
| 9,261,533 | B2 | 2/2016 | Rashidzadeh et al. |
| 10,048,348 | B2 | 8/2018 | Hussey |
| 10,811,118 | B2 | 10/2020 | Joo et al. |
| 10,830,820 | B2 | 11/2020 | Müller et al. |
| 2004/0113713 | A1* | 6/2004 | Zipper .................. H01H 9/541 |
| | | | 333/105 |
| 2008/0174331 | A1 | 7/2008 | Yuan-Chi et al. |
| 2011/0089966 | A1 | 4/2011 | Mayder et al. |
| 2013/0342236 | A1* | 12/2013 | Song ................ G01R 31/31926 |
| | | | 324/756.07 |
| 2014/0253099 | A1* | 9/2014 | Han ....................... G01R 19/00 |
| | | | 324/126 |
| 2017/0038453 | A1* | 2/2017 | Hussey .............. G01R 31/3191 |

FOREIGN PATENT DOCUMENTS

| | | |
|---|---|---|
| JP | 2013-088288 A | 5/2013 |
| JP | 6405346 B2 | 10/2018 |

OTHER PUBLICATIONS

Hu et al., A novel method for RF device's contact test. In 2014 IEEE International Wireless Symposium. Mar. 24, 2014:1-4.

Meixner et al., External Loopback Testing Experiences with High Speed Serial Interfaces. 2008 IEEE International Test Conference. Oct. 2008, 10 pages.

Moran et al., Advances In MEMS Switches For RF Test Applications. 2016 11th European Microwave Integrated Circuits Conference; Oct. 2016, pp. 440-443.

* cited by examiner

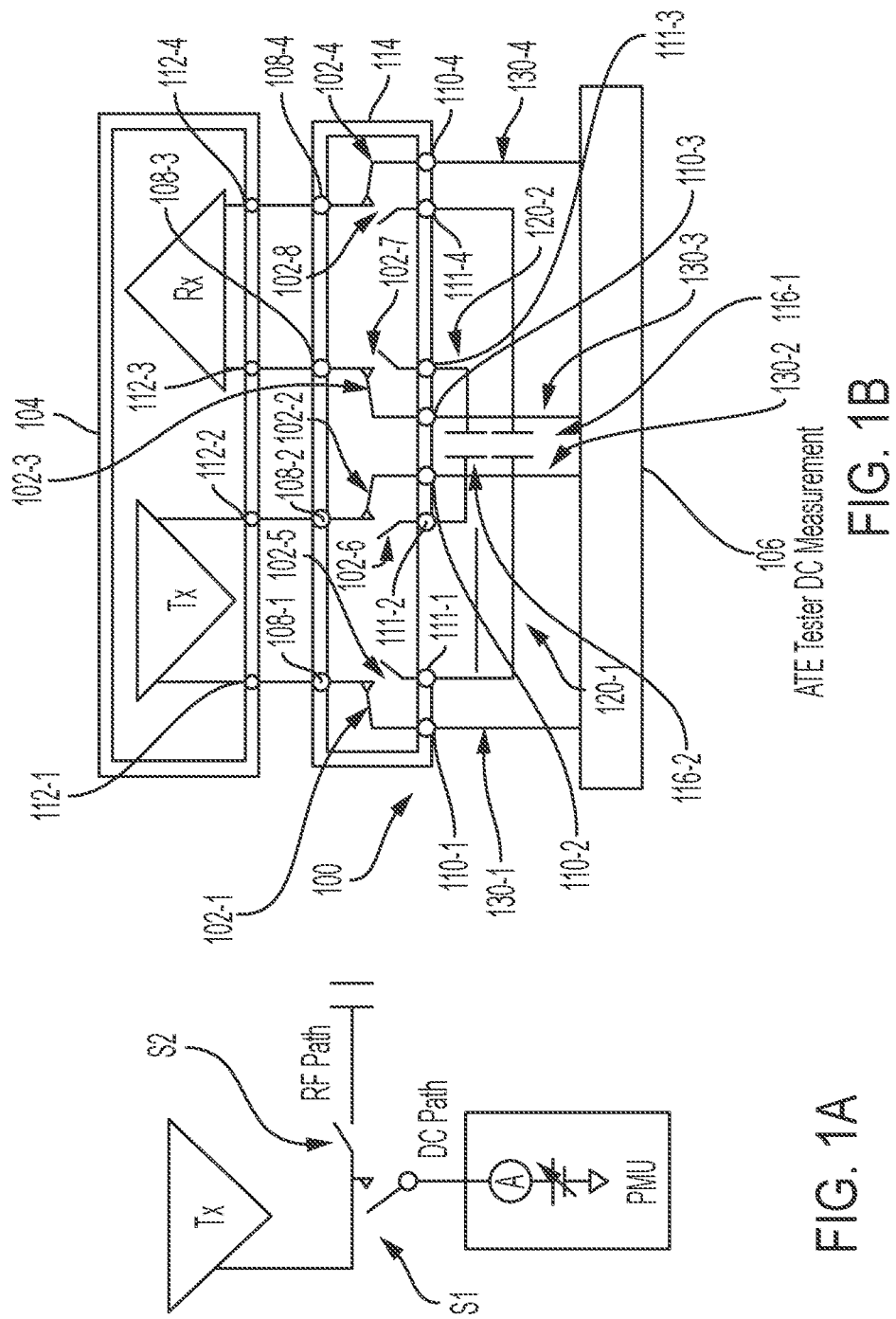

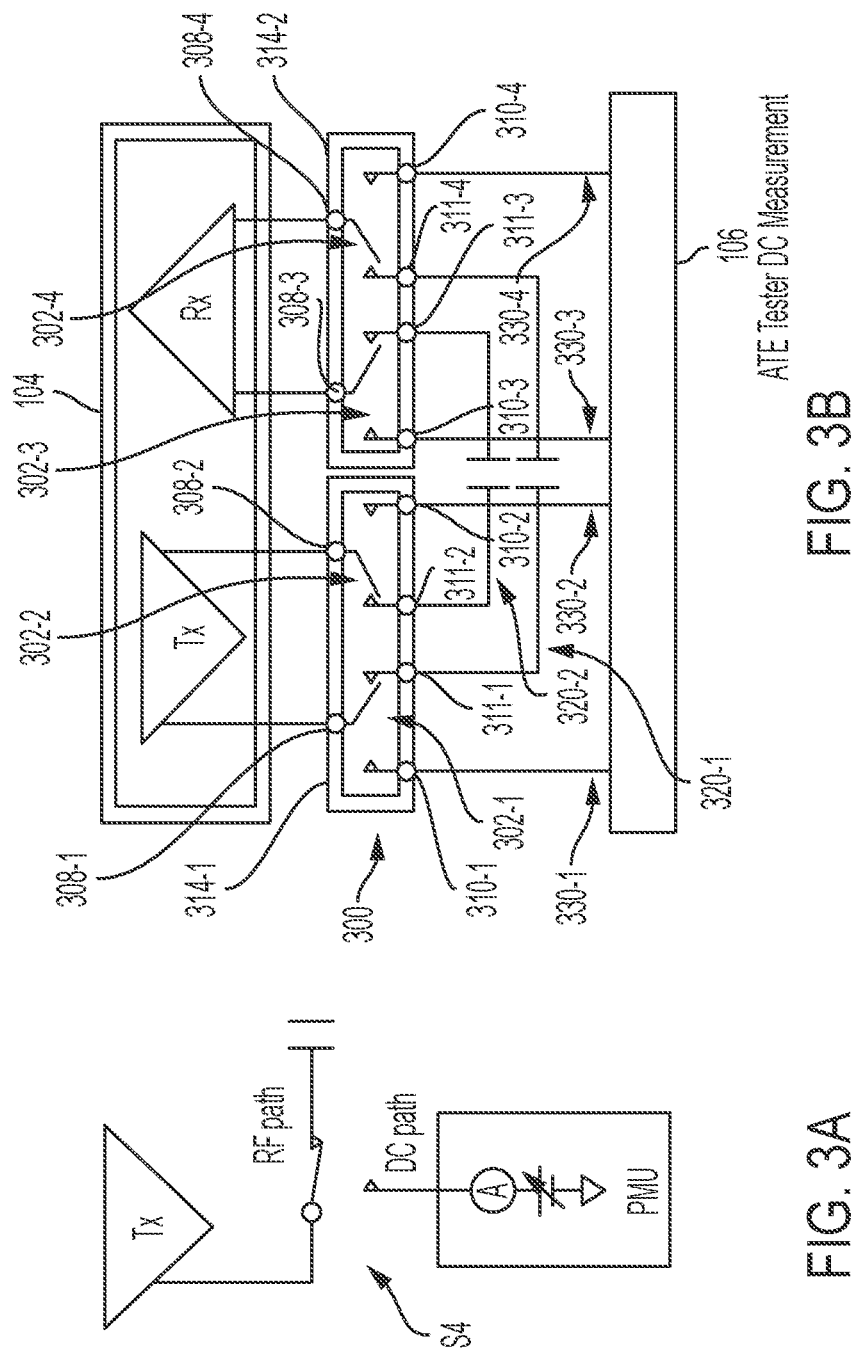

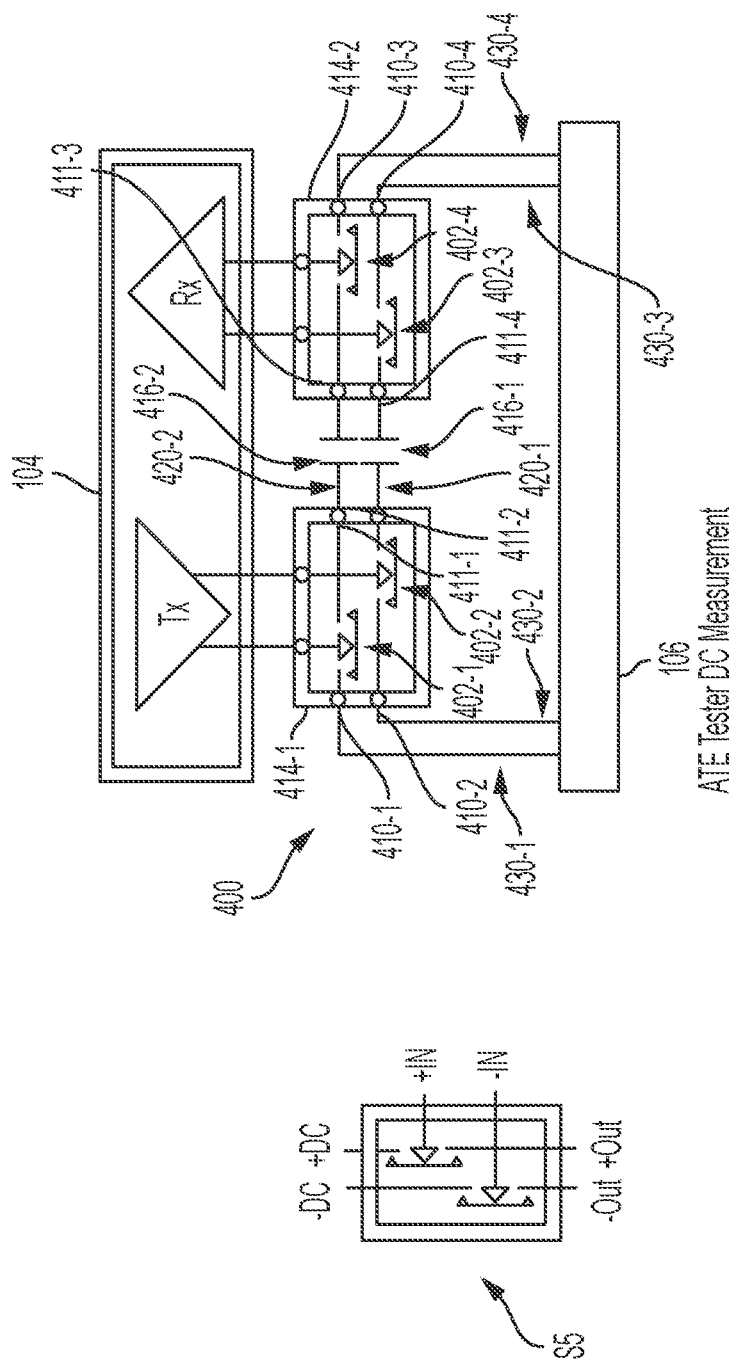

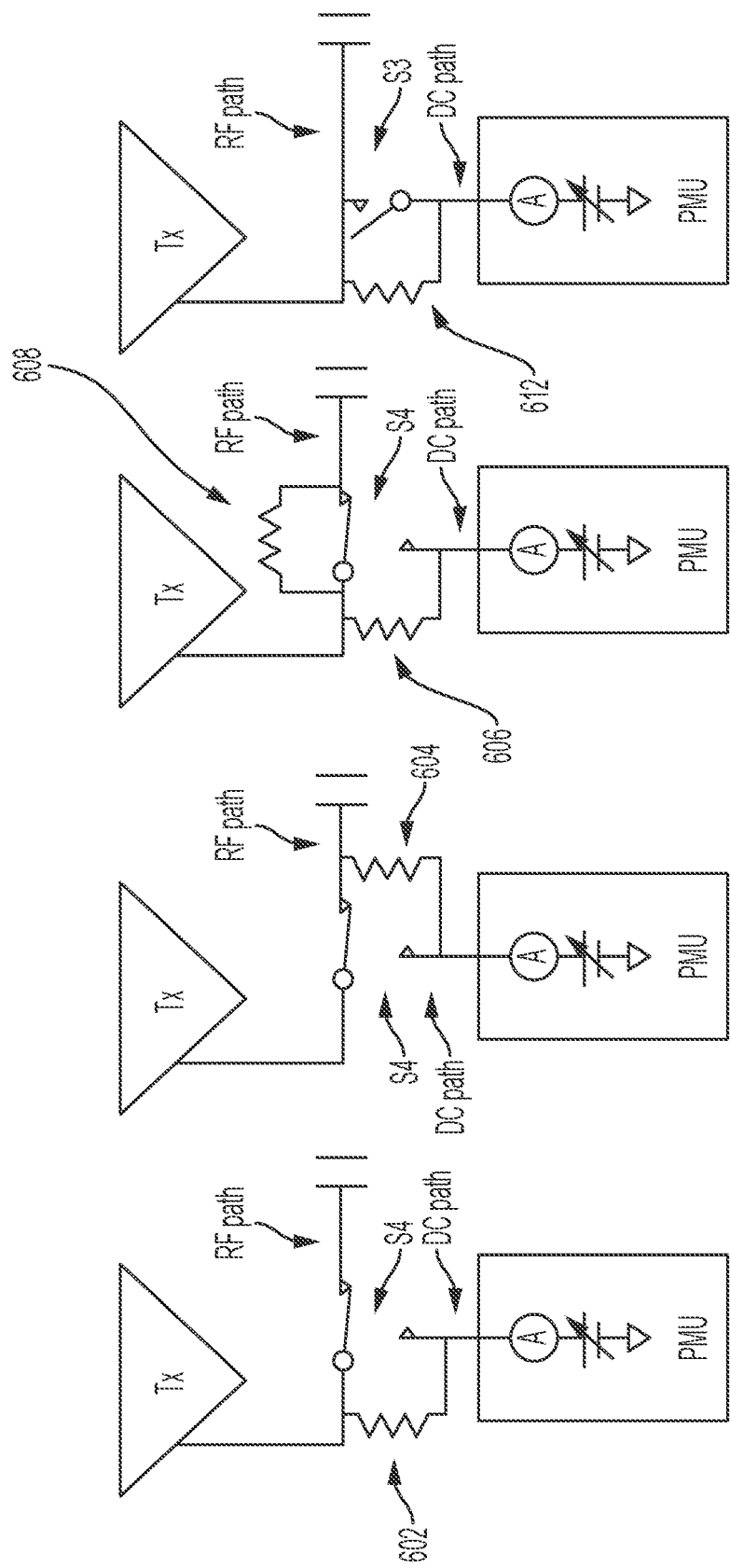

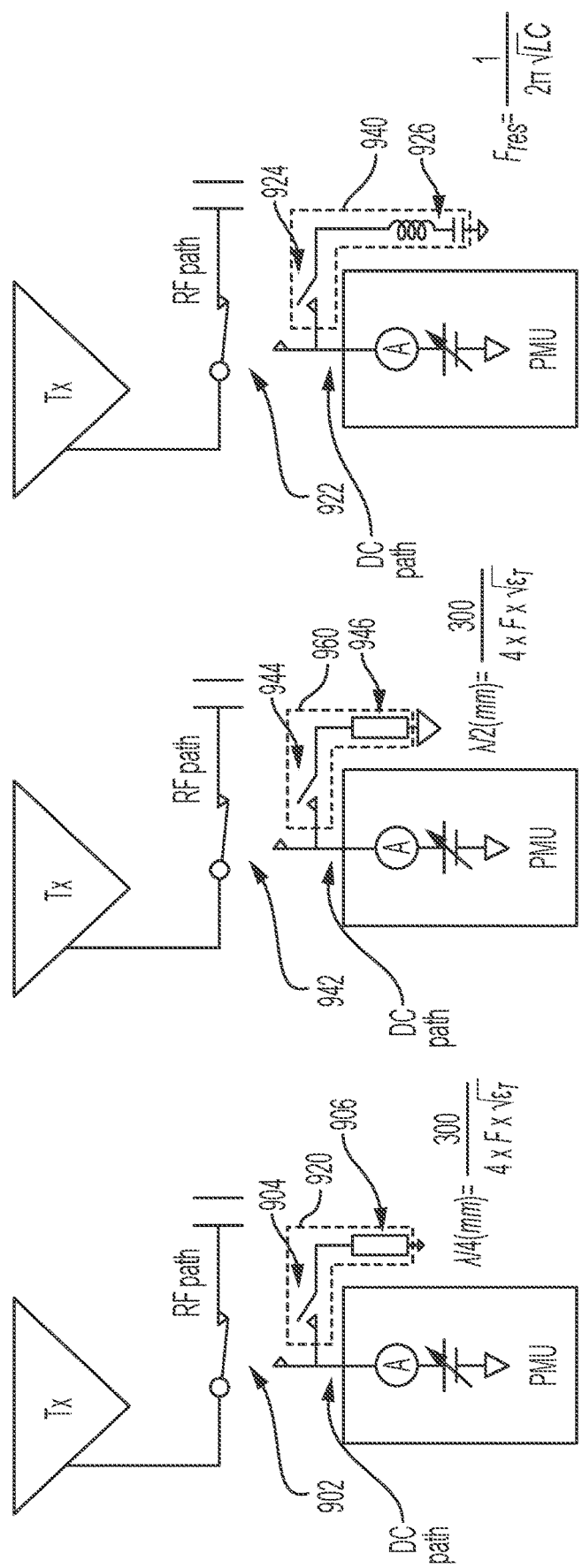

APPARATUSES AND METHODS FOR TESTING SEMICONDUCTOR CIRCUITRY USING MICROELECTROMECHANICAL SYSTEMS SWITCHES

CROSS-REFERENCE TO RELATED APPLICATIONS

This application claims the benefit of U.S. Provisional Application No. 63/190,203, filed May 18, 2021, and entitled, "APPARATUSES AND METHODS FOR TESTING SEMICONDUCTOR CIRCUITRY USING MICROELECTROMECHANICAL SYSTEMS SWITCHES," the entire contents of which are incorporated herein by reference.

FIELD OF THE TECHNOLOGY

The present application relates to apparatus and methods using microelectromechanical systems (MEMS) switches to test semiconductor circuitry.

BACKGROUND

Automatic test equipment (ATE) is used to test integrated circuits. For example, in high-speed testing for a device-under-test (DUT), such as a high-density semiconductor device, there may be dozens of transmitter/receiver (Tx/Rx) digital signal lines formed between multiple pairs of Tx/Rx pins of the semiconductor device, where the Tx/Rx digital signal lines are used to form one or more radio frequency (RF) loopback paths to facilitate the high-speed testing (also referred to as RF testing). In addition to the RF testing, the Tx/Rx pins of the semiconductor device may also need to be tested in a direct current (DC) measurement for DC connection.

SUMMARY

In some embodiments, an apparatus is provided that includes a plurality of first terminals configured to be coupled to respective pins on a semiconductor circuit under test; a plurality of second terminals configured to be coupled to a test equipment; and a plurality of microelectromechanical systems (MEMS) switches coupled to the plurality of first terminals and the plurality of second terminals, the plurality of MEMS switches are configured to: (A) operate in a first state to enable a direct current (DC) path between the semiconductor circuitry and the test equipment; and (B) operate in a second state to enable a radio frequency (RF) path between a transmitter (Tx)/receiver (Rx) pin and a Rx/Tx pin of the semiconductor circuitry.

In some embodiments, a method for performing testing on a semiconductor circuitry using an apparatus coupled between the semiconductor circuitry and testing equipment is provided that includes: (A) controlling a plurality of MEMS switches of the apparatus to operate in a first state to enable a DC path between the semiconductor circuitry and the testing equipment; (B) when the DC path is enabled, performing a DC test on the semiconductor circuitry using the DC path; (C) controlling the plurality of MEMS switches to operate in a second state to enable an RF path between a pair of Tx pin and Rx pin of the semiconductor circuitry; and (D) when the RF path is enabled, performing an RF test on the semiconductor circuitry using the RF path.

In some embodiments, an apparatus is provided that includes a MEMS switch block. The MEMS switch block includes: a plurality of common terminals configured to be respectively coupled to a plurality of test pins of a semiconductor circuit; a plurality of first terminals configured to be coupled to DC test equipment; a plurality of second terminals; a plurality of first MEMS switches each configured to be coupled to a respective one of the plurality of common terminals and a respective one of the plurality of first terminals to connect/disconnect a respective DC signal line from a respective test pin of the semiconductor circuit to the test equipment; and a plurality of second MEMS switches each configured to be coupled to a respective one of the plurality of common terminals and a respective one of the plurality of second terminals, wherein a first MEMS switch and a second MEMS switch of the plurality of second MEMS switches are configured to connect/disconnect an RF signal line between a first test pin and a second test pin of the semiconductor circuit. The MEMS switch block is configured to: (A) operate in a first state, wherein each of the plurality of first MEMS switches is configured to connect the respective DC signal line from the respective test pin of the semiconductor circuit to the test equipment, and wherein the first MEMS switch and the second MEMS switch of the plurality of second MEMS switches are configured to disconnect the RF signal line between the first test pin and the second test pin of the semiconductor circuit; and (B) operate in a second state, wherein each of the plurality of first MEMS switches is configured to disconnect the respective DC signal line from the respective test pin of the semiconductor circuit to the test equipment, and wherein the first MEMS switch and the second MEMS switch of the plurality of second MEMS switches are configured to connect the RF signal line between the first test pin and the second test pin of the semiconductor circuit.

BRIEF DESCRIPTION OF THE DRAWINGS

Some embodiments of the disclosure, as well as features and advantages thereof, will become more apparent by reference to the description herein taken in conjunction with the accompanying drawings. The components in the figures are not necessarily to scale. Moreover, in the figures, like-referenced numerals designate corresponding parts throughout the different views.

FIG. 1A is a simplified schematic diagram showing two switches that switchably provide for a DC path or an RF path within a system such as that for testing a device under test (DUT), in accordance with some embodiments.

FIG. 1B is a schematic diagram of a MEMS switch block including a switch shown in FIG. 1A, the MEMS switch block being coupled in between a DUT and automated test equipment (ATE) for providing a DC path and an RF loopback path for testing the DUT, in accordance with some embodiments.

FIG. 3A is a simplified schematic diagram showing a single-pole-double-throw (SPDT) switch that switchably provides for a DC path or an RF path in a system such as that for testing a DUT, in accordance with some embodiments.

FIG. 3B is a schematic diagram of a MEMS switch block including multiple switches as shown in FIG. 3A, the MEMS switch block being coupled in between a DUT and an ATE for providing both a DC path and an RF path in a system such as that for testing the DUT, in accordance with some embodiments.

FIG. 4A is a simplified schematic diagram showing a MEMS teeter-totter switch block in accordance with some embodiments.

FIG. 4B is a schematic diagram of multiple teeter-totter MEMS switches shown in FIG. 4A, the teeter-totter MEMS switches being coupled in between a DUT and an ATE for providing both a DC path and an RF path in a system such as that for testing the DUT, in accordance with some embodiments.

FIGS. 6A-6D show schematic diagrams of various implementations of a bleeding circuit for use in a system such as that for testing a DUT, in accordance with some embodiments.

FIGS. 9A-9C show schematic diagrams of variations of a shunt circuit additionally comprising RF resonators for use in a system such as that for testing a DUT, in accordance with some embodiments.

DETAILED DESCRIPTION

Figures 2A, 2B:
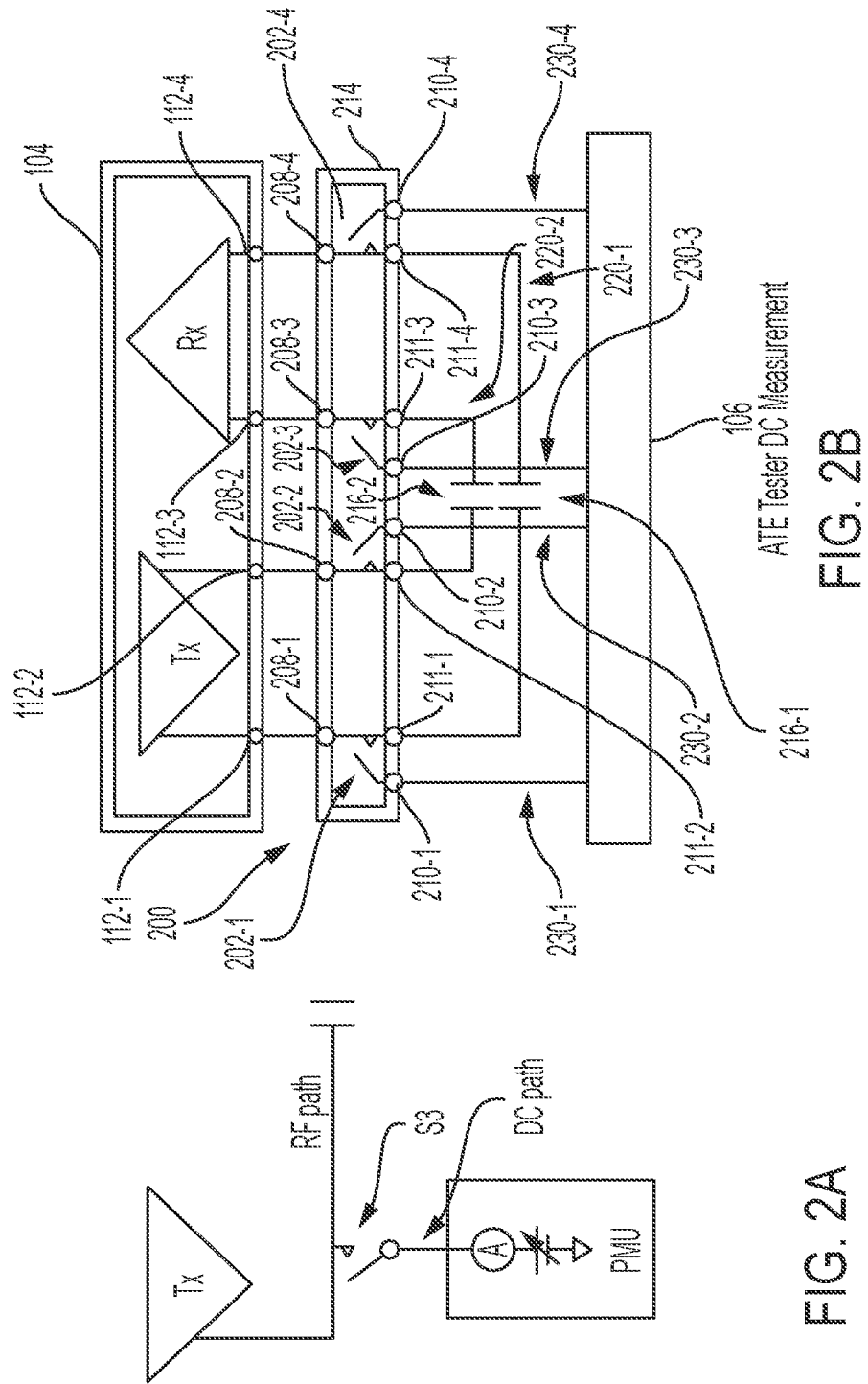
FIG. 2A is a simplified schematic diagram showing a pass-through RF path and a switch that switchably provides for a DC path in a system such as that for testing a DUT, in accordance with some embodiments.
FIG. 2B is a schematic diagram of a MEMS switch block including a switch as shown in FIG. 2A, the MEMS switch block being coupled in between a DUT and an ATE to provide a pass-through RF loopback path and a DC path for testing the DUT, in accordance with some embodiments.

Some semiconductor chips are tested with two separate types of tests. A first test is a direct current (DC) test. A second test is a radio frequency (RF) test. Conventionally, when both tests are performed on a semiconductor device, two separate passes are performed, by separate automatic test equipment (ATE). The first pass uses DC test equipment to perform a DC test to test the connection of test pins, such as transmitter (Tx) and receiver (Rx) pins of the semiconductor device. Thus, the DC test is also referred to as the DC contact test. The second pass uses RF test equipment to perform an RF test using the digital signal lines formed between the Tx/Rx pins of the semiconductor device. In such conventional two-pass testing, the connections between the Tx/Rx pins of the semiconductor device and the test equipment must be reconfigured between the DC test and the RF test.

The inventors have recognized and appreciated that the existing two-pass solution to semiconductor testing is cumbersome and time consuming because it requires reconfiguring the physical connections between the device under test (DUT) and the ATE to perform the DC and RF tests. The inventors have also recognized and appreciated that some systems provide a switching mechanism between DC and RF tests. However, these systems are limited in their applications because of the drawbacks associated with the switching technology. For example, an RF relay circuit that is used in the RF switching usually has a large footprint and thus, increases the layout of the test circuit board and the associated cost. Furthermore, the relay circuit introduces a longer switching time. Additionally, because the RF testing requires high frequency (e.g., 32 GBps or higher), noise and interference may be introduced when switching between DC and RF tests.

Accordingly, the inventors have developed various switching technologies that may be used to switch between DC and RF tests. In some embodiments, an apparatus may be implemented to enable multiple test states, such as DC test and/or RF test of a semiconductor device, e.g., semiconductor circuitry or an integrated circuit (IC) chip. The apparatus may include one or more microelectromechanical systems (MEMS) switch blocks coupled between the DUT and the ATE. The apparatus may be configured to enable/disable a DC path or an RF path to switch between a DC test and an RF test without reconfiguring the connections between the DUT and the ATE. The DC path may be used to perform a DC contact test for one or more pins of the DUT. The RF path may be used to perform an RF test for the DUT.

In some embodiments, the switching apparatus may include a plurality of first terminals configured to be coupled to respective pins on a DUT (e.g., a semiconductor chip). For example, test pins including Tx/Rx pins may be located at an edge of the chip to form one or more loopbacks each between a respective pair of Tx/Rx pins during an RF test. The switching apparatus may also include a plurality of second terminals configured to be coupled to DC test equipment, such as a phasor measure unit (PMU). The apparatus may include a plurality of MEMS switches configured to be coupled between the DUT and the ATE.

In some embodiments, each MEMS switch block may include a plurality of MEMS switches. The plurality of MEMS switches may be configured to operate in a first state and a second state. When the MEMS switches operate in the first state, a DC path may be enabled between the DUT and the ATE, allowing for a DC parametric test to be performed on the DUT. When the MEMS switches operate in the second state, an RF path may be enabled between Tx/Rx pins of the DUT, allowing for an RF test to be performed.

In some embodiments, each of the DC path and the RF path may include one or more signal lines for performing a DC test and an RF test, respectively. For example, each of the signal lines in the RF path may be configured to be connected between a respective pair of Tx/Rx pins of the DUT to form a loopback path for performing an RF loopback testing for the DUT. In some examples, each of the signal lines in the RF path may include a capacitor. A DC path may include one or more signal lines between respective test pins (e.g., a Tx/Rx pin) and the test equipment for performing a DC contact test.

Various configurations of the apparatus are provided to enable the switching between DC an RF tests. In some embodiments, another configuration of the switching apparatus may be provided that includes a first switch configured to open/close to enable/disable a DC path, and a second switch configured to open/close to enable/disable an RF path. For example, in a first state, the first switch may be controlled to enable the DC path, where the second switch may be controlled to disable the RF path. This allows for the DC test to be performed on the DUT. In a second state, the first switch may be controlled to disable the DC path, where the second switch may be controlled to enable the RF path. This allows for the RF test to be performed the DUT.

Various configurations may be provided to optimize the switching between a DC test and an RF test. In some embodiments, in the configuration described above, the second switch may be optimized to switch at high speed to enable/disable the RF path during an RF high speed test, whereas the first switch may be optimized for DC switching at a lower speed. In some examples, the switches in a MEMS switch block may include one or more bumped MEMS switches having multiple bumped contacts to be in contact with a circuit board. The bumped MEMS switch(es) may be mountable to the circuit board without wiring connections to the circuit board. This configuration may enable high speed switching.

In some embodiments, a MEMS switch block may include one or more teeter-totter switches. For example, a single-pole-double-throw (SPDT) teeter-totter switch may be included along a DC path and an RF path, where an input of the teeter-totter switch may be configured to be coupled to a Tx/Rx pin of the semiconductor device, and two other terminals of the teeter-totter switch may be coupled respective nodes in the DC and RF paths. This configuration allows one single teeter-totter switch to switch between the DC path and the RF path, which results in a saving of a switch in comparing to using one switch for the DC path and another switch for the RF path.

In some embodiments, another configuration of a MEMS switch block may include a hardwire that passes through the MEMS switch block, where hardwire inside the MEMS switch block forms a portion of the RF path. The MEMS switch block may also include at least a switch configured to switch the DC path open or close. In such configuration, in a first state, the MEMS switch block may be configured to enable the DC path for DC testing. In a second state, the MEMS switch block may be configured to disable the DC path, which allows for RF testing through the hardwired RF path.

Various configurations may be provided to isolate the DC path and the RF path during switching of DC and RF tests, when the MEMS switches operate to switch between the two. In some embodiments, the switching apparatus may include one or more bleeding circuits each coupled to a respective one of the MEMS switches. The bleeding circuit may be configured to prevent a charge buildup at a node of the respective MEMS switch coupled thereto when the respective MEMS switch is configured to switch from the first state to the second state. In a non-limiting example, a bleeding circuit may include a resistor.

Additionally, and/or alternatively, the switching apparatus may include one or more shunt circuits each respectively coupled to a MEMS switch of a MEMS switch block, a DC path, or an RF path. When the MEMS switch operates between the DC test and the RF test, the shunt circuit may be configured to provide isolation between the DC path and the RF path. In some examples, the shunt circuit may include a shunt switch coupled to ground. When the DC path is disabled, the shunt switch may be configured to short to ground to improve isolation between the DC path and the RF path. Additionally, an RF resonator may be coupled to the shunt switch of the shunt circuit to improve the isolation between the DC and RF paths. The RF resonator may include a resistor, or an LC circuit configured to operate in a given wavelength.

In some embodiments, the apparatus described herein may be implemented in various configurations to optimize the layout profiles, the pinouts and/or improve performance of the switching between DC and RF tests. In some examples, a MEMS switch block may be implemented in a MEMS package (or die) or multiple MEMS packages. In some examples, a MEMS package may include two teeter-totter MEMS switches, or four teeter-totter MEMS switches. In some examples, the MEMS switches may be implemented in multiple MEMS packages, e.g., two MEMS packages, or other suitable number of MEMS packages. In some examples, the MEMS switches may have suitable pinouts for each respective various configurations described above. For example, the plurality of first terminals configured to be connected to the DUT may be arranged on one side of the MEMS die, and the plurality of second terminals configured to be connected to the test equipment may be arranged on the opposite side of the MEMS die. In some examples, a MEMS package may integrate a portion of any suitable number of signal lines of the RF path. Additionally, and/or alternatively, the MEMS package may integrate any suitable number of capacitors on the RF path. In other examples, the capacitor(s) on the RF path may be disposed external to the MEMS package. In some examples, the MEMS package may also integrate any of the bleeding circuit(s), and/or the shunt circuit(s) described above in the present disclosure.

In some embodiments, variations of the configurations described above may be provided to enable various test scenarios. For example, one or more of the MEMS switches in the MEMS switch block may each include a triple-throw switch configured for various implementations. In an implementation, one or more triple-throw switches may be configured to enable a connection between the DUT and another instrument (e.g., a high-speed instrument) in addition to the DC path and the RF path. In another implementation, the triple-throw switch(es) may be configured to enable another RF path to allow for an alternative RF path. The alternative path may be configured to introduce skews between differential channels or a passive circuit during testing. In another implementation, the MEMS switches may be configured to connect to additional Tx/Rx pins of the DUT. Such configuration may allow a Tx pin to be coupled to multiple Rx pins or allow an Rx pin to be coupled to multiple Tx pins to enable efficient use of the test pins of the DUT and facilitate various test configurations.

Various embodiments described in the present disclosure may facilitate switching between DC and RF testing of a semiconductor chip. For example, a testing method may include controlling at least a MEMS switch coupled to a DC path of a DUT and an RF path of the DUT, where the MEMS switch may be configured to operate in a first state to enable the DC path, and to operate in a second state to enable the RF path. The method may include performing a DC test of the DUT when the MEMS switch is operating in the first state and performing an RF test of the DUT when the MEMS switch is operating in the second state. When switching between a DC test and an RF test, the method may include activating a bleeding circuit to bleed any undesirable charges built on a node of the MEMS switch(es). The method may also include activating a shunt circuit to isolate the DC path and RF path.

Various embodiments described above may provide advantages over conventional semiconductor testing systems and methods for DC and RF testing, which may require reconfigurations of wires when switching between the DC test and the RF test. The method and apparatus and their various embodiments described above for semiconductor testing facilitate two-pass testing (DC and RF tests) without requiring reconfiguration of the testing equipment. Instead, MEMS switches are used to enable/disable the DC path or the RF path between the DUT and ATE. Furthermore, the MEMS switches allow for low footprint configurations as traditional relay switches take significant space. MEMS switches also allow for switches of various speeds to be implemented in a single MEMS switch block and/or optimized for either a DC path or an RF path between the DUT and ATE. When the DC path and RF path are integrated in the same MEMS switch block, various bleeding and/or shunt circuits can be provided to isolate the interference between the DC path and the RF path.

Whereas various embodiments have been described, it is appreciated that other embodiments and implementations are possible. Accordingly, the embodiments described herein are examples, not the only possible embodiments and implementations. Furthermore, the advantages described above are not necessarily the only advantages, and it is not necessarily expected that all of the described advantages will be achieved with every embodiment. Details of various embodiments of the present disclosure are further illustrated in the figures.

FIG. 1A is a simplified schematic diagram showing two switches that switchably provide for a DC path or an RF path in a system such as that for testing a DUT, in accordance with some embodiments. As shown, switch S1 may be coupled between a test pin of a DUT (e.g., Tx/Rx pin) and test equipment (e.g., PMU). Switch S2 may be coupled between the test pin of the DUT and a terminal on an RF path. Each of the switches S1 and S2 may be a single-pole-single-throw (SPST) and may be controlled to operate in a first or a second state. For example, when operating in the first state, switch S1 may close and switch S2 may open, and thus, the DC path may be enabled. In this case, an electrical connection is formed between the test pin of the DUT and the test equipment PMU. When operating in the second state, switch S1 may open and switch S2 may close, and the DC path may be disabled (e.g., the electrical connection between the DUT and the test equipment is cut off). In this case, the RF path may be enabled to allow an RF test to be performed.

FIG. 1B is a schematic diagram of a MEMS switch block 114 including multiple MEMS switches, the MEMS switch block 114 being configured to be coupled in between a DUT 104 and test equipment 106 and enable an RF loopback path (e.g., 120) or a DC path (130), in accordance with some embodiments. As shown in FIG. 1B, in some embodiments, an apparatus 100 may include a plurality of first terminals 108 and a plurality of second terminals 110. The plurality of first terminals (e.g., 108-1 to 108-4) may be configured to be coupled to respective test pins 112 (e.g., Tx/Rx pins) on a DUT 104. For example, one of the first terminals 108-1 may be coupled to pin 112-1 on the DUT 104. Another one of the first terminals 108-4 may be coupled to pin 112-4 on the DUT 104. The plurality of second terminals (e.g., 110-1 to 110-4) may be configured to be coupled to test equipment 106. In some embodiments, apparatus 100 may also include a plurality of third terminals (e.g., 111-1 to 111-4), which may be configured to form the RF loopback path.

In some embodiments, apparatus 100 may further include a plurality of microelectromechanical systems (MEMS) switches (102) coupled to the plurality of first terminals (108), the plurality of second terminals (110), and the plurality of third terminals (111). As shown in FIG. 1B, the plurality of MEMS switches may be disposed in a single MEMS switch block 114, where the MEMS switch block may be a MEMS switch package (or die). Each of the switches 102-1 to 102-8 may be a switch S1 or S2 in FIG. 1A. In the configuration shown in FIG. 1B, eight SPST switches are included in the MEMS switch block 114. Other types of switches may also be possible.

With further reference to FIG. 1B, the plurality of MEMS switches 102 may be configured to operate in a first state and a second state to respectively enable a DC path to allow a DC test (e.g., a DC contact test) to be performed, and enable an RF path to allow an RF test to be performed. In some embodiment, each of the DC path and RF path may have one or more signal lines. As shown in FIG. 1B, the DC path 130 may have multiple signal lines 130-1 to 130-4 formed between Tx/Rx pins of the DUT 104 and the test equipment 106 through some of the plurality of MEMS switches 102. The RF path 120 may have multiple signal lines 120-1 and 120-2 formed between the plurality of third terminals (e.g., 111-1 to 111-4). For example, a first MEMS switch 102-1 may be coupled between terminal 108-1 and terminal 110-1, and configured to connect/disconnect a first signal line 130-1 of the DC path 130 from a Tx/Rx pin 112-1 of the DUT 104 to the test equipment 106. When connected, the first signal line 130-1 extends from the Tx/Rx pin of the DUT, through terminals 108-1 and 110-1, to the test equipment 106. Similarly, a second MEMS switch 102-4 may be coupled between terminal 108-4 and terminal 110-4, and configured to connect/disconnect a second signal line of the DC path 130-2 from a test pin (e.g., 112-2) of the DUT 104 to the test equipment 106. When connected, the signal line 130-2 extends from the Tx/Rx pin of the DUT, through terminals 108-2 and 110-2, to the test equipment 106. Other signal lines 130-3 and 130-4 of the DC path may be formed in a similar manner.

In some embodiments, an RF path may be formed as an RF loopback path between a pair of Tx/Rx pins of the device 104 for performing an RF test. For example, the RF path 120 may have two signal lines 120-1 and 120-2. Signal line 120-1 may be formed between a pair of Tx/Rx pins of a semiconductor device, where the signal line 120-1 extends from a Tx/Rx pin (e.g., 112-1) of the semiconductor device, through terminal 108-1, switch 102-5, terminals 111-1 and 111-4, switch 102-8, and terminal 108-4, and return to an Rx/Tx pin (e.g., 112-4) of the semiconductor device to form an RF loopback path. Similarly, signal line 120-2 of the RF path may be formed between another Tx/Rx pin (e.g., 112-2) and another Rx/Tx pin (e.g., 112-3) of the semiconductor device through terminals 108-2, 108-2, switches 102-6 and 102-7, and terminals 111-2 and 111-3. In some embodiments, each of the signal lines of the RF path may also include a capacitor, such as 116-1 and 116-2. As shown in FIG. 1B, the DC path and the RF path may have overlapped portions, such as the portions from test pin 112-1 to terminal 108-1, from test pin 112-2 to terminal 108-2, from test pin 112-3 to terminal 108-3, and test pin 112-4 to terminal 108-4.

Apparatus 100 described above may be controlled to allow for a DC test or an RF test to be performed to the DUT in the same configuration (e.g., as shown in FIG. 1B). Accordingly, a method is provided to perform testing on a DUT using the apparatus 100. The method may include controlling the plurality of MEMS switches (e.g., 102) to operate in a first state or a second state. In the first state, the MEMS switches 102-1 to 102-4 may be configured to close to enable the DC path. In this state, the signal lines of the DC path, e.g., 130-1 to 130-4, may be formed as previously described. When the DC path is enabled, the method may perform a DC test on the DUT using the DC path. For example, a DC contact test may be performed by the test equipment 106 on the Tx/Rx pins (e.g., 112-1 to 112-4) of the DUT. During the DC test, the RF path (e.g., signal lines 120-1, 120-2) may be disabled via open MEMS switches 102-5 to 102-8. RF test equipment (not shown in FIG. 1B) may also be configured to cut off the signals in the RF path. In some embodiments, the capacitor(s) (e.g., 116-1, 116-2) along the RF path may be configured to stop the signal flow in the RF path to further isolate the RF path from the DC path.

In the second state, MEMS switches 102-5 to 102-8 may be configured to close to enable the RF path 120, as previously described. In this state, the DC path may be disabled with open switches 102-1 to 102-4, and the signal line(s) of the DC path 130 between Tx/Rx pins of the DUT 104 and the test equipment 106 may be cut. This allows for the RF test of the DUT 104 to be performed over the RF path 120. For example, when the signal line 120-1 is connected, the RF test equipment 106 may be configured to transmit a signal from test pin 112-1 of the DUT 104 through the signal line 120-2 to return (loopback) to a test pin 112-4 of the DUT.

The configuration in FIG. 1B provides advantages in facilitating two-pass testing (DC and RF tests) without requiring reconfiguration of the ATE. Instead, MEMS switches are used to enable/disable the DC path or the RF path between the DUT and the ATE. Furthermore, MEMS switches allow for low footprint configuration as traditional relay switches take significant space. MEMS switches also allow for switches of various speeds to be implemented in a single MEMS switch block and/or optimized for either DC path or RF path between the DUT and ATE. For example, the DC switches (e.g., 102-1 to 102-4 used for enabling/disabling the DC path) and RF switches (e.g., 102-5 to 102-8 used for enabling/disabling the RF path) may be designed for their particular type of signal conduction, for example having suitable dimensions, materials, and contact configurations to facilitate respective optimal DC and RF operations. Additionally, forming the DC and RF paths close to each other inside a MEMS block will achieve better shunt to the DC test.

Although the embodiments in FIGS. 1A-1B have been illustrated to have four test pins (112-1 to 112-4) on the DUT 104, it is appreciated that any suitable number of pins may be possible. Similarly, apparatus 100 may have any suitable number of MEMS switches (102). Apparatus 100 may also have any suitable number of first terminals (108), second terminals (110), and/or third terminals (111). Accordingly, the DC path and the RF path may have any suitable number of signal lines.

FIGS. 2-4 show variations of the apparatus shown in FIGS. 1A-1B for enabling a DC path or an RF path for performing two-pass testing. For example, FIG. 2A is a simplified schematic diagram showing a pass-through RF path and a switch S3 that switchably provides for a DC path for testing, in accordance with some embodiments. Switch S3 may be coupled between a test pin of a DUT (e.g., Tx pin) and test equipment (e.g., PMU). Switch S3 may be controlled to open or close. When switch S3 is closed in a first state, the DC path may be enabled in that an electrical connection is formed between the test pin of the DUT and the test equipment. When switch S3 is open in a second state, the DC path may be disabled (e.g., the electrical connection between the DUT and the test equipment is cut off). In this case, the RF path may be enabled to allow an RF test to be performed.

FIG. 2B is a schematic diagram of an apparatus 200 including a MEMS switch block 214 that may implement one or more switches S3 shown in FIG. 2A. The MEMS switch block 214 may be coupled in between a DUT 104 and test equipment 106 to provide a pass-through RF loopback path and a DC path, in accordance with some embodiments. As shown in FIG. 2B, in some embodiments, apparatus 200 may include a plurality of first terminals 208, a plurality of second terminals 210, and a plurality of MEMS switches 202 coupled between the first terminals 208 and the second terminals 210. Apparatus 200 may also include a plurality of third terminals 211 configured to form the RF path. Apparatus 200 may be configured in a similar manner as apparatus 100 (in FIG. 1B), with a difference being that first terminals 208-1, 208-2, 208-3, and 208-4 are respectively connected to third terminals 211-1 to 211-4 to each form a respective permanent electrical path as part of the RF path.

As shown in FIG. 2B, the plurality of MEMS switches 202-1 to 202-4 may be configured to operate in a first state and a second state to respectively enable a DC path 230 to allow for a DC test (e.g., a DC contact test) or enable an RF path 220 to allow for an RF test to be performed on the DUT 104. In the first state, multiple signal lines (e.g., 230-1 to 230-4) of the DC path 230 may be formed between Tx/Rx pins of the DUT 104 and the test equipment 106 through the plurality of MEMS switches 202-1 to 202-4. As shown, a first MEMS switch 202-1 may be coupled between terminal 208-1 and terminal 210-1, and configured to connect/disconnect a first signal line 230-1 of the DC path between a Tx/Rx pin 112-1 of the DUT 104 to the test equipment 106. When connected, the first signal line 230-1 of the DC path extends from the Tx/Rx pin 112-1 of the DUT 104, through terminals 208-1 and 210-1, to the test equipment 106. In this configuration, the DC path and the RF path may have an overlapped portion from the Tx/Rx pin 112-1 of the DUT 104 to the terminal 108-1. Similarly, switches 202-2 to 202-4 may be configured to respectively form a signal line of the DC path. For example, as shown in FIG. 2B, switch 202-2 is configured to connect/disconnect signal line 230-2 of the DC path; switch 202-3 is configured to connect/disconnect signal line 230-3 of the DC path; and switch 202-4 is configured to connect/disconnect signal line 230-4 of the DC path.

With further reference to FIG. 2B, the RF path is further explained. In some embodiments, at least a portion of the RF path is hardwired inside the MEMS switch block 214. For example, RF path 220 may include RF signal lines 220-1 and 220-2 each formed between a respective pair of Tx/Rx pins of a semiconductor device. As shown in FIG. 2B, a first signal line 220-1 of the RF path is formed to extend from a Tx/Rx pin 112-1 of the semiconductor device 104, through terminals 208-1 and 211-1 and terminals 211-4 and 208-4, and return to an Rx/Tx pin 112-4 of the semiconductor device 104 to form an RF loopback path. In this example, the signal line 220-1 of the RF path may include a first portion (hardwired portion) coupled between terminals 208-1 and 211-1 to form a permanent electrical path therebetween inside the MEM switch block 214; and a second portion (hardwired portion) coupled between terminals 208-4 and 211-4 to form a permanent electrical path therebetween in the MEM switch block 214. A second signal line 220-2 of the RF path may also be formed in a similar manner and includes a first portion and a second portion inside the MEMS switch block 214. For example, signal line 220-2 may include a permanent electric path inside the MEMS switch block between terminals 208-2 and 211-2 and a permanent electric path inside the MEMS switch block between terminals 208-3 and 211-3. In some embodiments, each of the signal lines of the RF path may include a respective capacitor, e.g., 216-1 and 216-2.

As shown, each of the signal lines of the DC path 230 may also overlap with a corresponding signal line of the RF path. For example, the DC path and the RF path may have overlapped portions from Tx/Rx pin 112-1 to terminal 208-1, from Tx/Rx pin 112-2 to terminal 208-2, from Rx/Tx pin 112-3 to terminal 208-3; and from Rx/Tx pin 112-4 to terminal 208-4.

In some embodiments, apparatus 200 described above may be controlled to allow for a DC test or an RF test to be performed to the DUT 104. Accordingly, a method is provided to perform testing on a DUT 104 using the apparatus 200. The method may include controlling the plurality of MEMS switches (e.g., 202-1 to 202-4) to operate in a first state or a second state. In the first state, the MEMS switches 202-1 to 202-4 may be configured to close to enable the DC path by connecting respective signal lines 230-1 to 230-4 of the DC path between respective Tx/Rx pins of the DUT 104 and the test equipment 106 through respective first terminals 108-1 to 108-4 and respective second terminals 210-1 to 210-4. When the DC path is enabled, the method may perform a DC test on the DUT 104 using the DC path. For example, a DC contact test may be performed by the test equipment 106 on the Tx/Rx pins 110-1 to 110-4 of the DUT 104. During the DC test, the RF test equipment (not shown in FIG. 2B) may be configured to cut off the signals in the RF path. In some embodiments, the capacitor (e.g., 216-1 and 216-2) along the RF path may be configured to stop the signal flow in the RF path to further isolate the RF path from the DC path.

In the second state, the MEMS switches 202-1 to 202-4 may be configured to open to enable the RF path. In this state, the signal lines of the DC path between Tx/Rx pins of the DUT 104 and the test equipment 106 may be cut. This allows for the RF test of the DUT to be performed over the RF path. For example, the RF test equipment may be configured to transmit a signal from a Tx/Rx pin (e.g., 112-1) of the DUT 104 through signal line 220-1, which allows the signal to return to a corresponding Rx/Tx pin (e.g., 112-4) of the DUT 104.

Figure 2C:
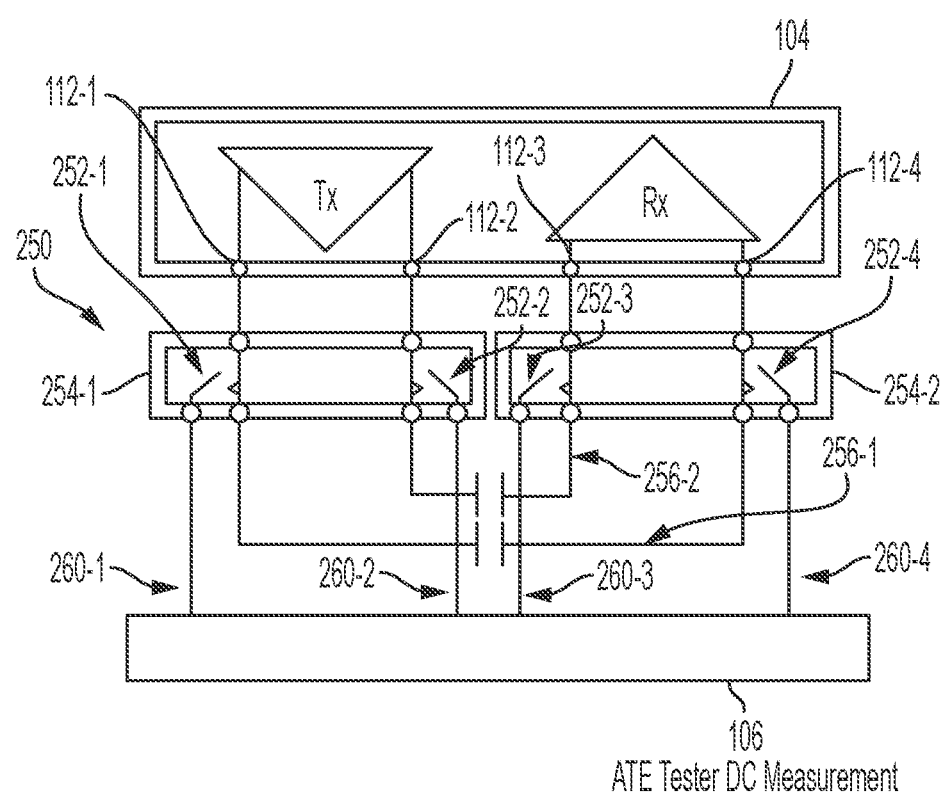
FIG. 2C is a schematic diagram of a variation of the configuration in FIG. 2B using multiple MEMS switch blocks, in accordance with some embodiments.

As shown in FIG. 2B, the plurality of MEMS switches may be disposed in a single MEMS switch block 214, where the MEMS switch block may be a MEMS switch package (or die). In this configuration, four SPST switches are included in the MEMS switch package 214. In another configuration, the plurality of MEMS switches may be disposed in multiple MEMS switch blocks. For example, FIG. 2C is a schematic diagram of a variation of the configuration shown in FIG. 2B. Apparatus 250 is similar to apparatus 200 (in FIG. 2B), with a difference being that the plurality of MEMS switches 252-1 to 252-4 are included in two MEMS switch blocks 254-1 and 254-2 instead of one MEMS switch block. In particular, MEMS switches 252-1 and 252-2 are configured to connect/disconnect the signal lines 260-1 and 260-2 of the DC path, respectively, whereas MEMS switches 252-3 and 252-4 are configured to connect/disconnect the signal lines 260-3 and 260-4 of the DC path, respectively. As shown in FIG. 2C, two MEMS switch blocks, each having two SPST switches, may be used. With further reference to FIG. 2C, the RF signal lines (e.g., 256-1, 256-2) may be formed between the two MEMS switch blocks 254-1 and 254-2.

Configurations as shown in FIGS. 2B and 2C provide the same advantages as the configuration in FIG. 2A does. In addition, the pass-through portion(s) of the RF path will cause fewer stops a signal needs to pass through (e.g., with the use of common terminal 208-1/211-1). Such reduction of the number of stops in the RF path will shorten the RF path, thus reduce the resonance which may occur at high speed (e.g., 20-30 Ghz).

Figure 2D:
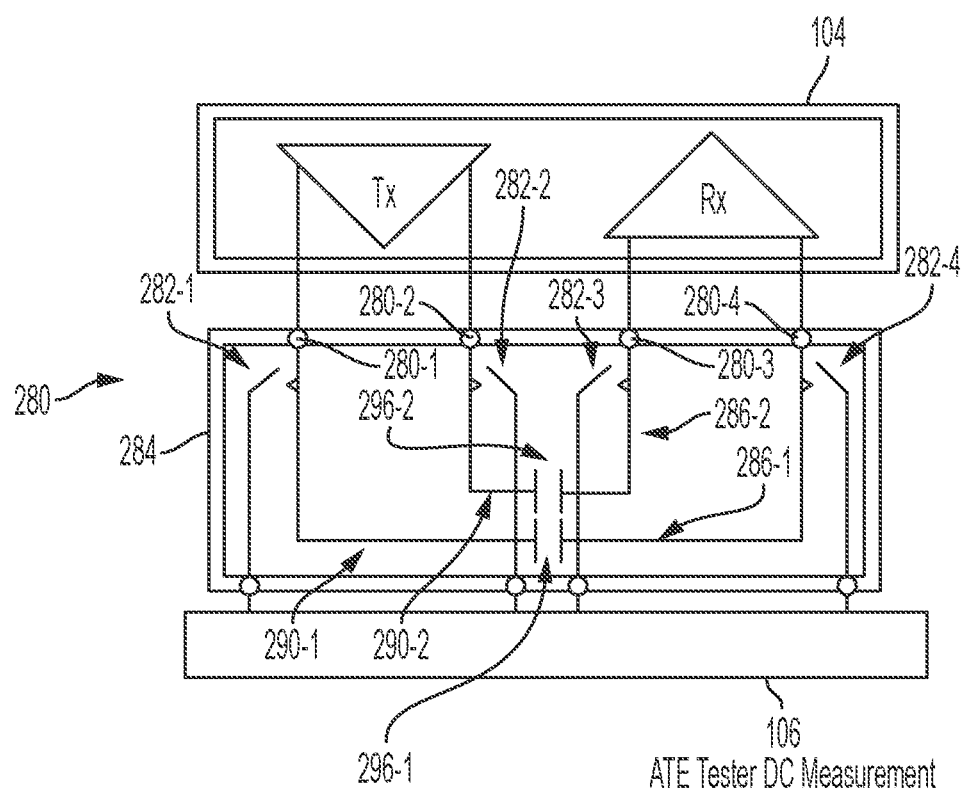
FIG. 2D is a schematic diagram of a MEMS switch block including MEMS switches shown in FIG. 2B, with an RF loopback path with capacitors integrated inside the MEMS switch block, in accordance with some embodiments.

FIG. 2D is a schematic diagram of another variation of the configurations in FIGS. 2B-2C. Apparatus 280 is similar to apparatuses 200 and 250, with a difference being that the capacitors in the RF path are integrated inside the MEMS switch block 284. As shown, the plurality of MEMS switches 282-1 to 282-4 are disposed inside the switch block 284 and the pass-through portion(s) of the RF path are completely formed inside the MEMS block. For example, a signal line 290-1 of the RF path may be formed between terminals 280-1 and 280-4; and a signal line 290-2 of the RF path may be formed between terminals 280-2 and 380-3. The two capacitors 296-1 and 296-2 coupled respectively on the signal lines 286-1 and 286-2 are also integrated inside the same switch block 284.

FIGS. 3A-3B illustrate another variation of the apparatuses shown in FIGS. 1A-2D. FIG. 3A is a simplified schematic diagram showing a single-pole-double-throw (SPDT) switch S4 that switchably provides for a DC path or an RF path, in accordance with some embodiments. FIG. 3B shows an example apparatus 300 in which multiple MEMS switches (e.g., 302-1 to 302-4) are disposed in two separate MEMS blocks 314-1 and 314-2. In some embodiments, each MEMS switch may be a switch S4 shown in FIG. 3A and may be configured to enable/disable a DC path or an RF path. As shown in FIG. 3B, each MEMS switch may be an SPDT switch, with one throw for connecting a respective portion of signal line of the RF path and another throw for connecting a respective signal line of the DC path.

In some embodiments, the MEMS switches 302-1 to 302-4 may be configured to operate in a first state and a second state. In the first state, each switch may be configured to connect a respective signal line of a DC path. For example, switch 302-1 may be configured to connect terminals 308-1 and 310-1 to connect signal line 330-1 of the DC path between a Tx/Rx pin of the DUT 104 and the ATE 106. Similarly, switch 302-2 may be configured to connect signal line 330-2 of the DC path; switch 302-3 connects signal line 330-3 of the DC path and switch 302-4 connects signal line 330-4 of the DC path.

With further reference to FIG. 3B, in the second state, each of the switches 302-1 to 302-4 may be configured to disconnect the respective signal line of the DC path and respectively connect a portion of an RF path. For example, switch 302-1 may be configured to connect terminals 308-1 and 311-1 and switch 302-4 may be configured to connect terminals 308-4 and 311-4, thus, both switches 302-1 and 302-4 connect the signal line 320-1 of the RF path. Similarly, in the second state, both switches 302-2 and 302-3 are configured to connect the signal line 320-2 of the RF path.

In some embodiments, the first and second state of the MEMS switches provide for a DC test or an RF test to be performed on the DUT 104, respectively. For example, in a DC test, each of the switches may be configured to operate in the first state and enable the DC path 330 from the Tx/Rx pins on the DUT 104 to the DC test equipment 106. In this state, the RF path is disabled. In an RF test, each of the switches may be configured to operate in the second state to enable the RF loopback path 320 between Tx/Rx pins on the DUT 104. In this state, the DC path is disabled.

The configuration in FIG. 3B allows optimizing the switches for DC or RF performance, for example, by using different resistances, different isolation characteristics or providing different circuits (e.g., using capacitors, bleeding circuits or shunt circuits) to each of the switches as will be shown herein in the present disclosure.

Figure 3C:
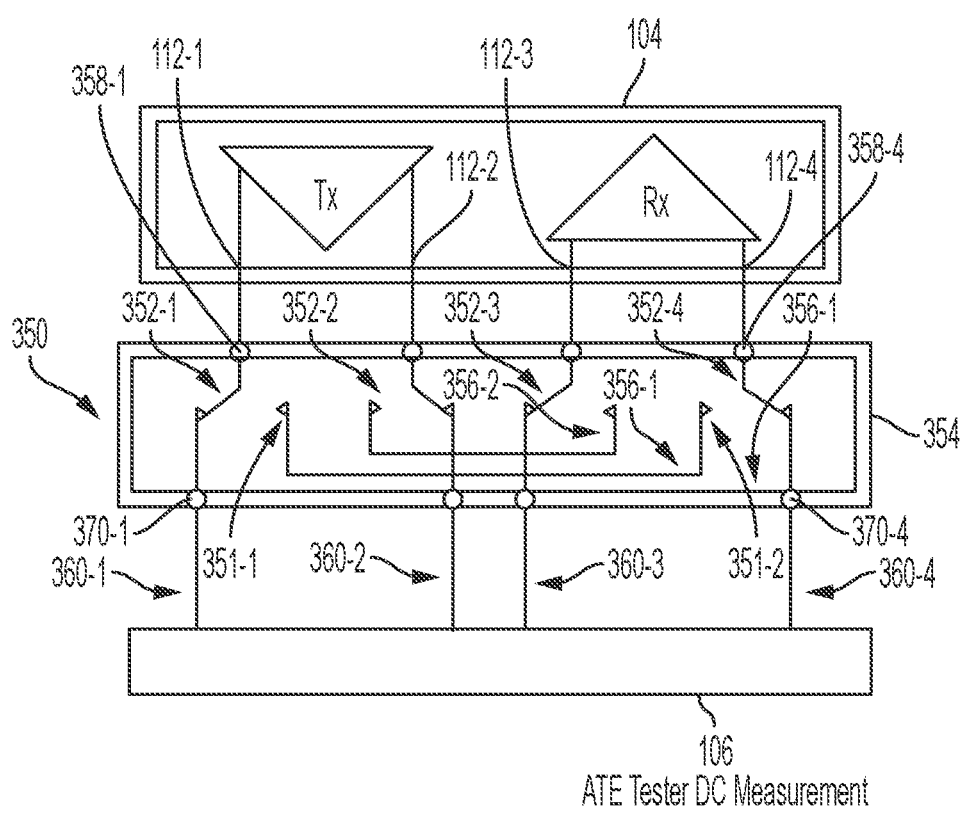
FIG. 3C is a schematic diagram of a variation of configuration of MEMS switch blocks in FIG. 3B, in which an RF loopback path is integrated inside a single MEMS switch block, in accordance with some embodiments.

FIG. 3C is a schematic diagram of a variation of a MEMS switch block for use in a system such as that for testing a DUT, in accordance with some embodiments. As shown in FIG. 3C, apparatus 350 is similar to apparatus 300 (in FIG. 3B) with a difference being that multiple MEMS switches 352-1 to 352-4 are disposed in a single MEMS switch block 354. In addition, the two signal lines 356-1 and 356-2 of the RF path are formed inside the MEMS switch block 354. For example, as shown in FIG. 3C, MEMS switch 352-1 is coupled to terminals 358-1, 370-1, and a node 351-1 of signal line 356-1 of the RF path. Similarly, MEMS switch 352-4 is coupled to terminals 358-4, 370-4, and a node 351-2 of the signal line 356-1 of the RF path. Switches 352-2 and 352-3 may be connected in a similar manner.

Thus, apparatus 350 may operate in a similar manner as apparatus 300 (in FIG. 3B). For example, switches 352-1 to 352-4 may be configured to operate in a first state to enable a DC path and a second state to enable an RF path to provide for a DC test and an RF test on the DUT, respectively. In the first state, switches 352-1 to 352-4 may be configured to connect respective signal lines 360-1 to 360-4 of the DC path from the DUT 104 to the test equipment 106. In the second state, switches 352-1 and 352-4 may be configured to connect signal line 356-1 of the RF path together. Similarly, switches 352-2 and 352-3 may be configured to connect signal line 356-2 of the RF path together.

FIG. 4A is a simplified schematic diagram showing a MEMS teeter-totter switch block, in accordance with some embodiments. As shown in FIG. 4A, a teeter-totter switch may include a structure that functions as a SPDT switch. As shown, switch block S5 includes input nodes +IN and −IN, first nodes +DC and −DC, and second nodes +OUT and −OUT. Switch S5 may be configured to operate in two states. In the first state, switch S5 may connect its input nodes +IN and −IN to first nodes +DC and −DC, respectively. In the second state, switch S5 may connect its input nodes +IN and −IN to second nodes +OUT and −OUT, respectively. As will be shown in FIG. 4B, switch S5 may be used to enable/disable a DC path or an RF path to provide for a DC test or an RF test on a DUT.

FIG. 4B is a schematic diagram of multiple teeter-totter MEMS switches 402-1 to 402-4 in an apparatus 400, where the teeter-totter MEMS switches may be configured to enable/disable a DC path or an RF path, in accordance with some embodiments. In an implementation shown in FIG. 4B, apparatus 400 may include four teeter-totter MEMS switches, each of which may be switch S5 shown in FIG. 4A. The input nodes (e.g., +IN, −IN) of each of the MEMS switches are configured to be coupled to differential signal terminals on the chip to be tested, e.g., +/− pins of Tx or +/− pins of Rx. The first nodes (e.g., +DC/−DC) of the switches may be coupled to terminals 410-1 to 410-4, respectively, where terminals 410-1 to 410-4 are configured to be coupled to the DC test equipment 106 to form respective signal lines (e.g., 430-1 to 430-4) of the DC path. The second nodes (e.g., +OUT/−OUT) of the switches may be coupled to terminals 411-1 to 411-4, respectively, where terminals 411-1 to 411-4 may be connected to form the RF path. For example, terminals 411-1 and 411-3 may be coupled to form a signal line 420-2 of the RF path, and terminals 411-2 and 411-4 may be coupled to form a signal line 420-1 of the RF path. In some embodiments, each signal line of the RF path may include a respective capacitor, e.g., 416-2 and 416-1.

As shown in FIG. 4B, apparatus 400 may be similar to apparatus 300 (in FIG. 3B), with a difference being that the multiple MEMS switches are teeter-totter MEMS switches. Similar to apparatus 300, apparatus 400 may also be configured to provide for a DC path or an RF path in a similar manner. Further shown in FIG. 4B, a total of two 2×SPDT MEMS switches may be used, as compared to four switches used in FIG. 3B. As such, using teeter-totter switches may save the number of switches.

Figure 5:
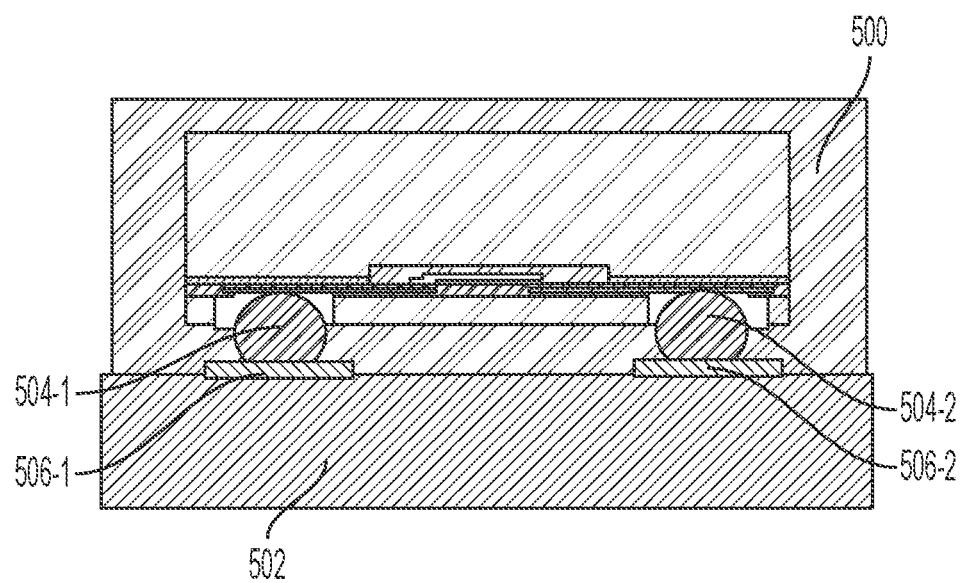
FIG. 5 shows a schematic diagram of a section view of a bumped MEMS switch that can be implemented in various embodiments described in the present disclosure for testing a DUT using high speed signals, in accordance with some embodiments.

FIG. 5 is a simplified schematic diagram of a section view of a bumped MEMS switch that can be implemented in various embodiments described above to enable operations in high speed, in accordance with some embodiments. As shown in FIG. 5, a MEMS switch block 500 may be mountable to a substrate 502 (e.g., a circuit board), where one or more terminals 504 of the MEMS switch block 500 may be bumped contacts that can be directly in contact with the substrate. For example, bump contacts 504 may be in contact with respective contacts 506 (e.g., a conductive layer) of the circuit. The configuration allows the bumped MEMS switch(es) mountable to the circuit board without wiring connections to the circuit board. Thus, high speed switching, such as speed at greater than 64 GHz/128 GBps range, may be enabled.

FIGS. 6-7 show examples of bleeding circuits that may be used with a MEMS switch in various embodiments described above. For example, FIGS. 6A-6D show schematic diagrams of various implementations of a bleeding circuit coupled to a switch, in accordance with some embodiments. The bleeding circuit may be used to prevent a charge built up on a floating node of a switch. As shown in FIG. 6A, a bleeding circuit 602 (e.g., a resistor) may be coupled in parallel between two nodes of a switch S4. When switch S4 switches from a DC path to an RF path, a charge built up on a node of the switch is discharged through the bleeding circuit 602. In FIG. 6B, a bleeding circuit 604 (e.g., a resistor) may be coupled to switch S4 in a similar manner, such as between other two nodes of the switch. When the RF path is connected, a charge built up on the switch is discharged through the bleeding circuit 604 in a similar manner. FIG. 6C shows two bleeding circuits 606 and 608 coupled to a same switch S4. FIG. 6D shows a variation of the configuration in which a bleeding circuit 612 is coupled to a switch S3, which is a different type from switch S4 (in FIG. 6A).

Figure 7B:
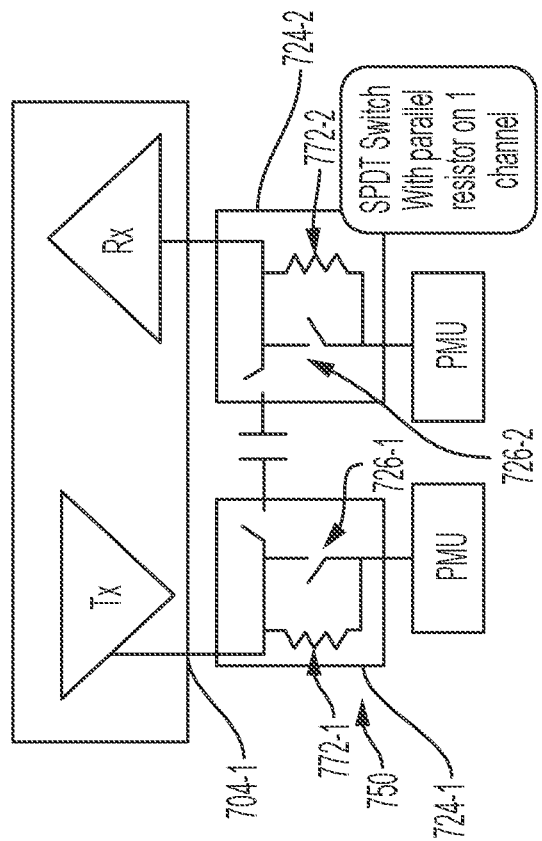
FIGS. 7A-7B show simplified schematic diagrams of various configurations of a MEMS switch block including a bleeding circuit having parallel resistors in a system such as that for testing a DUT, in accordance with some embodiments.
Figure 7A:
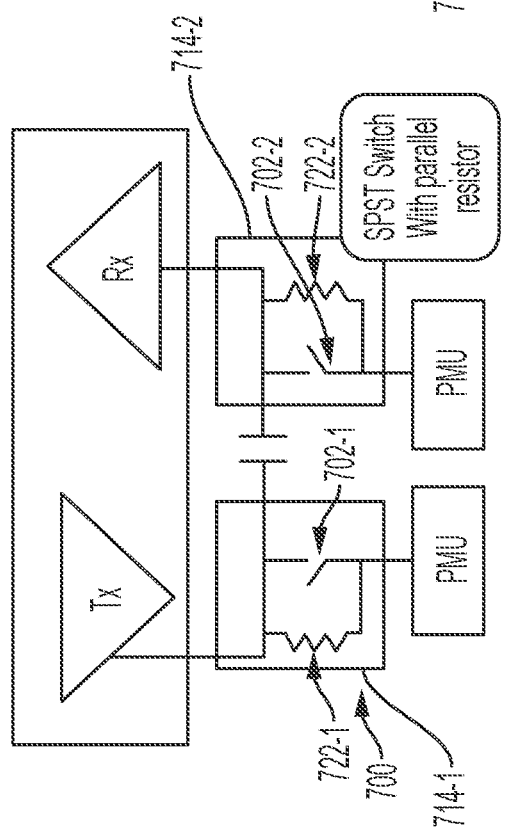

FIGS. 7A-7B show simplified schematic diagrams of various configurations of a MEMS switch block including a bleeding circuit having parallel resistors, in accordance with some embodiments. FIG. 7A shows a simplified schematic diagram of an apparatus 700, which includes a first MEMS switch block 714-1 and a second MEMS switch block 714-2. Each of the MEMS switch blocks may include one or more SPST switches (e.g., 702-1, 702-2). Such configuration is similar to the configuration shown in FIG. 2C. As shown in FIG. 7A, apparatus 700 may include one or more bleeding circuits (e.g., 722-1, 722-2) each coupled to a respective SPST switch on a DC path in parallel. FIG. 7B shows a similar configuration as FIG. 7A, with a difference being that that the MEMS switches (e.g., 726-1, 726-2) are each a SPDT switch. As shown in FIG. 7B, one or more bleeding circuits (e.g., 772-1, 772-2) may each be coupled to a respective SPDT switch on a DC path in parallel.

Figure 8A:
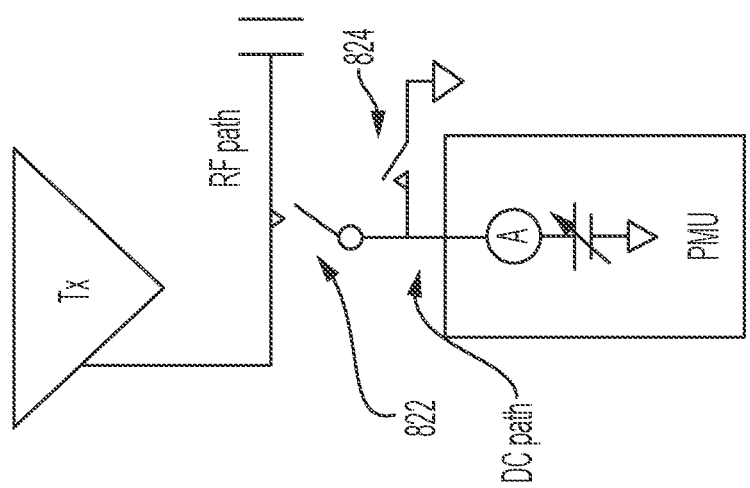
FIGS. 8A-8B show simplified schematic diagrams of various implementations of a shunt circuit for use in a system such as that for testing a DUT, in accordance with some embodiments.
Figure 8B:
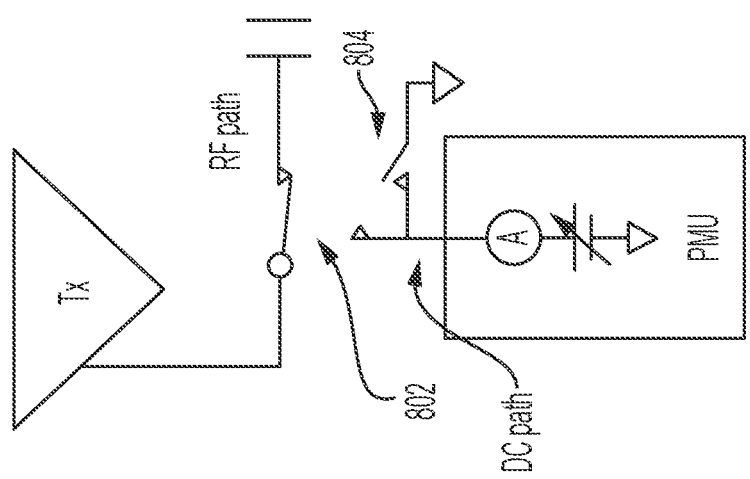
Figure 10:
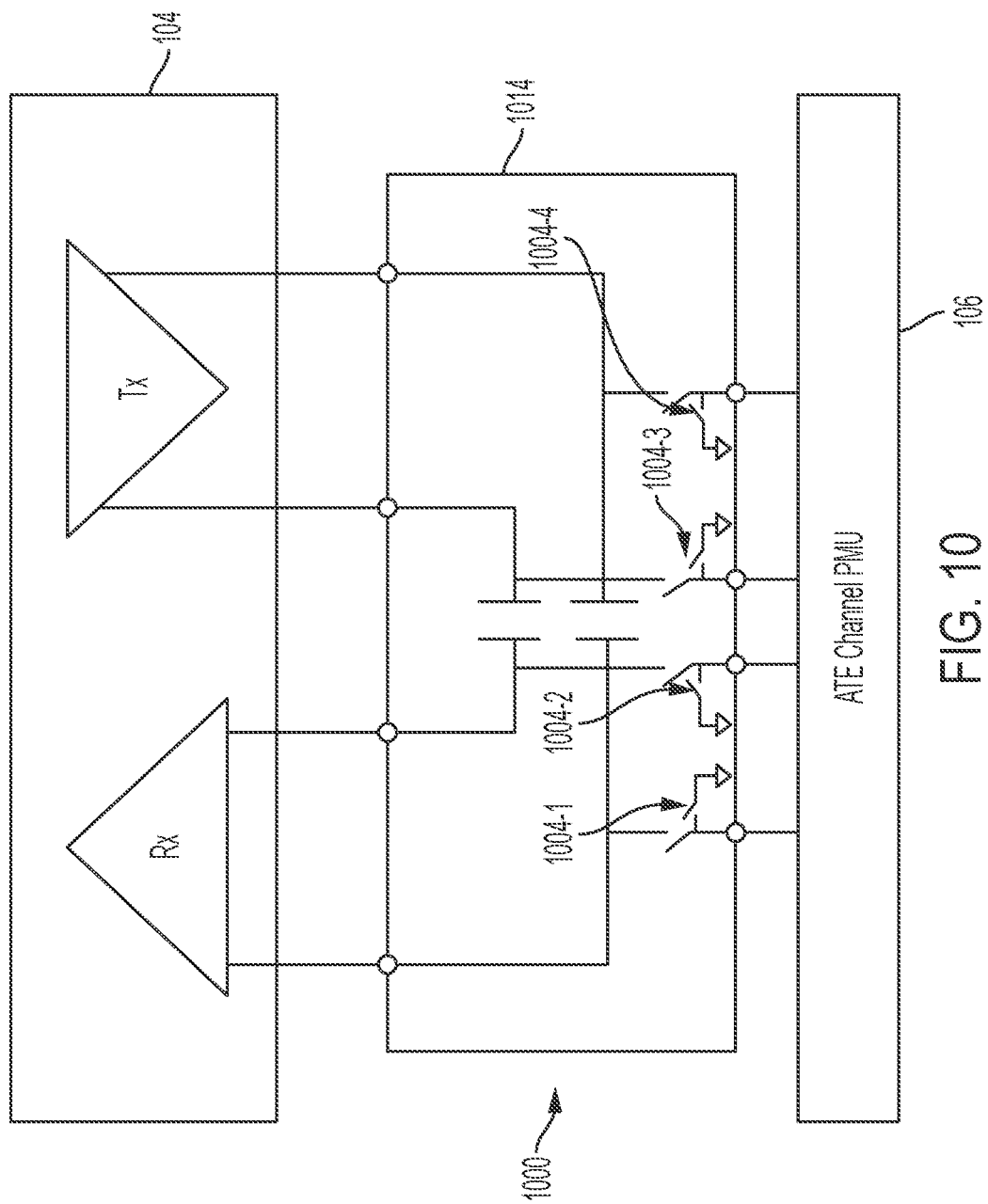
FIG. 10 is a schematic diagram of a MEMS switch block including integrated shunt circuits and pass-through RF path with capacitors for use in a system such as that for testing a DUT, in accordance with some embodiments.

FIGS. 8-10 show examples of shunt circuits for improving the isolation between a DC path and an RF path in any of the apparatuses previously described above. For example, FIGS. 8A-8B show simplified schematic diagrams of various implementations of a shunt circuit for use with a switch, in accordance with some embodiments. In some examples, a shunt circuit may be coupled to a MEMS switch to isolate the DC path from the RF path, when the RF path is enabled. As shown in FIG. 8A, shunt circuit 804 is coupled to a node of the switch 802. When switch 802 switches to disable the DC path, shunt circuit 804 may be configured to short the node of the switch to ground to isolate the RF path from the DC path. FIG. 8B shows a similar configuration as in FIG. 8A, with a difference being that switch 822 is a SPST switch and the RF path is a pass-through path (such as the configuration shown in FIGS. 2C-2D). In FIG. 8B, when switch 822 switches open to disable the DC path, shunt circuit 824 may be configured to short the node of the switch 822 to ground to isolate the RF path from the DC path. In some examples, in both configurations in FIGS. 8A-8B, shunt circuit 804, 824 may each include a respective shunt switch, which can be configured to open/close. In such case, when the shunt switches to close, the node of the switch to which the shunt circuit is coupled is shorted to ground, and thus, the DC path is isolated from the RF path.

FIGS. 9A-9C show schematic diagrams of variations of a shunt circuit additionally comprising RF resonators for use with a switch which may be implemented in any of the apparatuses previously described above. For example, in FIG. 9A, shunt circuit 920 may include a shunt switch 904 and a resistor 906 serially coupled to the shunt switch and ground. The shunt circuit 904 may be configured to operate as a quarter wave shunt. In FIG. 9B, shunt circuit 960 may be a variation of shunt circuit 920 (in FIG. 9A) in that the shunt circuit 960 may be configured to operate as a half wave shunt. In FIG. 9C, shunt circuit 940 may include a shunt switch 924 and a LC circuit 926 (e.g., an inductor serially coupled with a capacitor) serially coupled to the shunt switch and ground. The implementations shown in FIGS. 9A-9C may be coupled to MEMS switches in the apparatuses as described in various embodiments above. For example, the shunt circuits in FIGS. 9A-9C may be used in the configuration shown in FIG. 8A or FIG. 8B to improve the isolation between the DC path and the RF path.

FIG. 10 is a schematic diagram of a MEMS switch including integrated shunt circuits and pass-through RF path with capacitors, in accordance with some embodiments. In some embodiments, apparatus 1000 may be configured in a similar manner as apparatus 280 in FIG. 2D, with shunt circuits 1004-1 to 1004-4 integrated into the MEMS switch block 1014.

Figure 11:
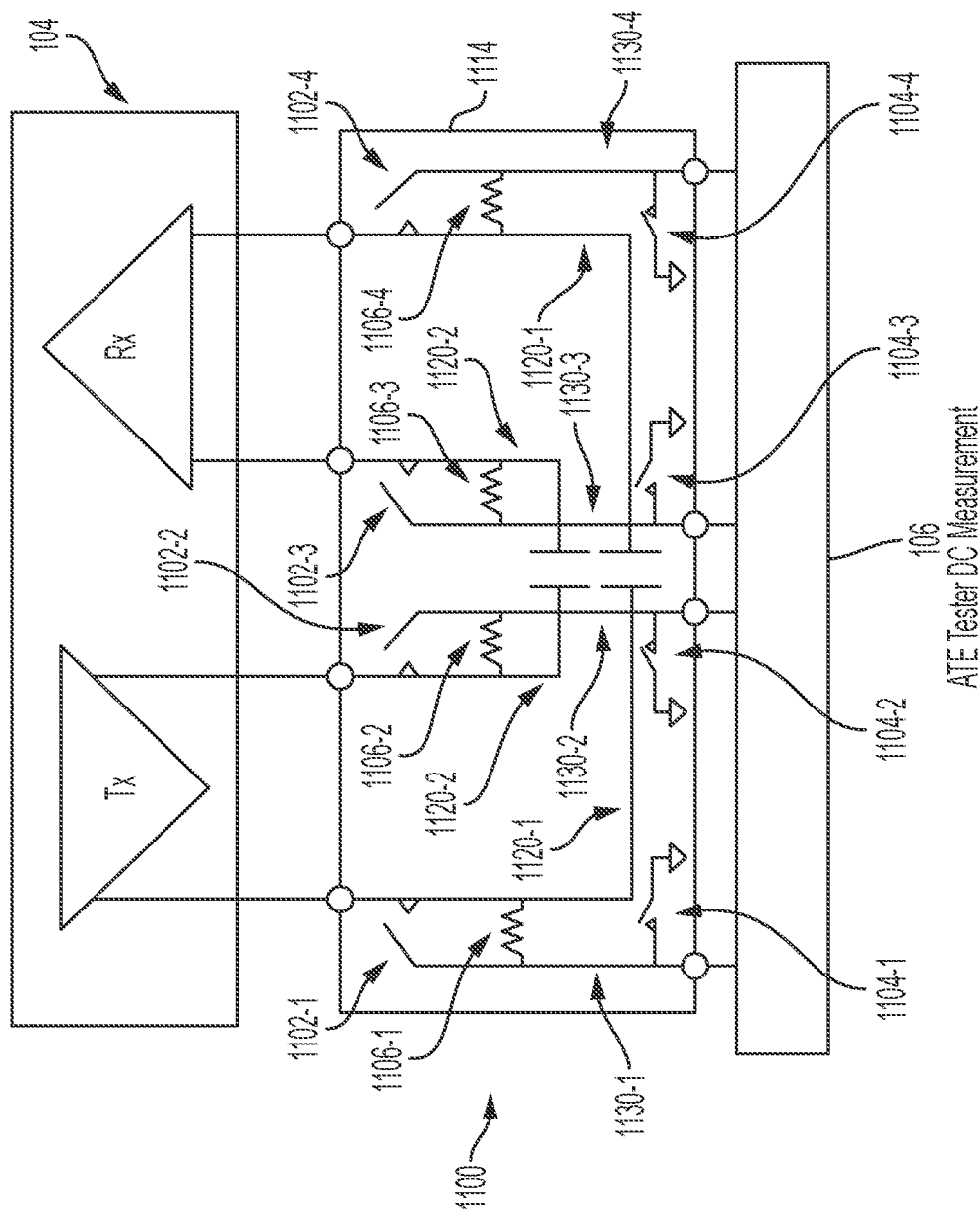
FIG. 11 is a schematic diagram of a MEMS switch block including integrated bleeding circuits and shunt circuits, and pass-through RF path for use in a system such as that for testing a DUT, in accordance with some embodiments.
Figure 12:
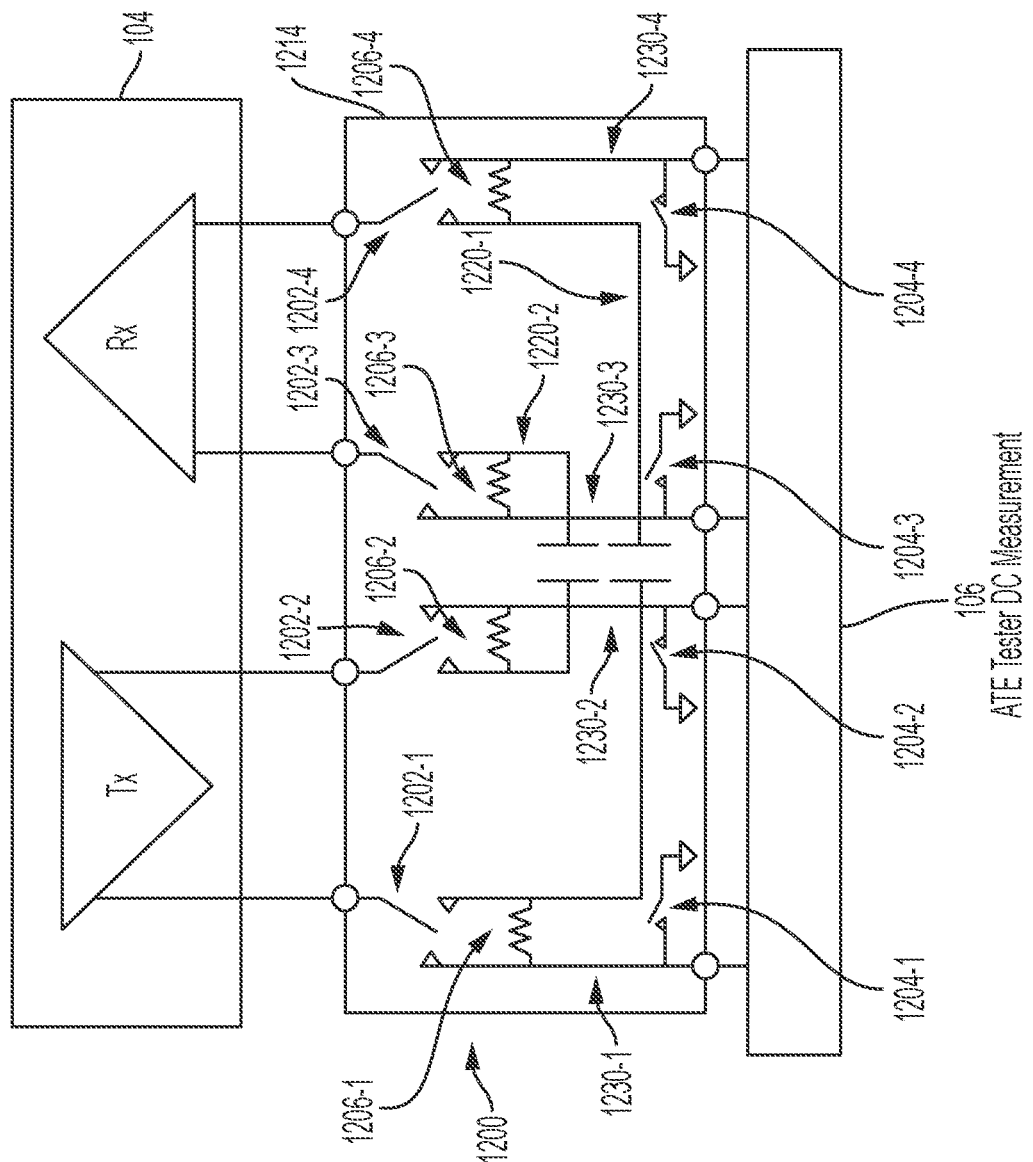
FIG. 12 is a schematic diagram of a MEMS switch block that switchably provides for a DC path or an RF path and includes integrated bleeding circuits and shunt circuits for use in a system such as that for testing a DUT, in accordance with some embodiments.

FIGS. 11-12 show examples of bleeding circuits and shunt circuits for improving the isolation between the DC path and the RF path in any of the apparatuses previously described above. For example, FIG. 11 is a schematic diagram of a MEMS switch including integrated bleeding circuits and shunt circuits, and pass-through RF path in accordance with some embodiments. In some embodiments, apparatus 1100 may be configured in a similar manner as apparatus 1000 (in FIG. 10), with multiple SPST MEMS switches, and additionally includes multiple bleeding circuits (e.g., 1106-1 to 1106-4) integrated into the MEMS switch block 1114. The bleeding circuits in apparatus 1000 may be arranged in a similar manner as shown in FIGS. 8A-8B.

As shown in FIG. 11, bleeding circuits 1006-1 to 1006-4 are each coupled between a signal line of the DC path and a signal line of the RF path. For example, bleeding circuit 1106-1 is coupled between signal line 1130-1 (of the DC path) and signal line 1120-1 (of the RF path). Similarly, bleeding circuit 1106-2 is coupled between signal line 1130-2 (of the DC path) and signal line 1120-2 (of the RF path). Bleeding circuit 1106-3 and 1106-4 are also arranged in a similar manner. As further shown in FIG. 11, shunt circuits 1104-1 to 1104-4 are coupled to respective signal lines of the DC path. For example, shunt circuit 1104-1 is coupled to signal line 1130-1 of the DC path. Shunt circuit 1104-2, 1104-3, and 1104-4 are also arranged in a similar manner.

FIG. 12 is a schematic diagram of a MEMS switch that switchably provide for a DC path or an RF path and includes integrated bleeding circuits and shunt circuits in any of the apparatuses previously described above, in accordance with some embodiments. As shown in FIG. 12, apparatus 1200 may be configured in a similar manner as apparatus 1100 (in FIG. 11), with a difference being that the multiple MEMS switches 1202-1 to 1202-4 are each a SPDT MEMS switch instead of a SPST MEMS switch as in apparatus 1100. As further shown in FIG. 12, each of the SPDT MEMS switches may be configured to enable a respective signal line of the DC path at one throw and enable a respective signal line of the RF path at a second throw. Thus, the SPDT MEMS switches in apparatus 1200 may configured in a similar manner as that shown in FIGS. 3B and 3C, with additional bleeding circuits (e.g., 1206-1 to 1206-4) each coupled between a signal line of a DC path and a signal line of a RF path (as similarly arranged in FIG. 11), and additional multiple shunt circuits (e.g., 1204-1 to 1204-4) each coupled to a respective signal line of the DC path.

Bleeding circuits and/or shunt circuits integrated in MEMS switch blocks in FIGS. 11-12 may operate in a similar manner as described in embodiments in FIGS. 8-10. For example, when the MEMS switches in apparatuses 1100 and 1200 switch from the DC path to the RF path, the charges built on the nodes of the MEMS switches may be discharged through the bleeding circuits. The shunt circuits may also operate to allow isolation between the DC path and the RF path.

Figure 13:
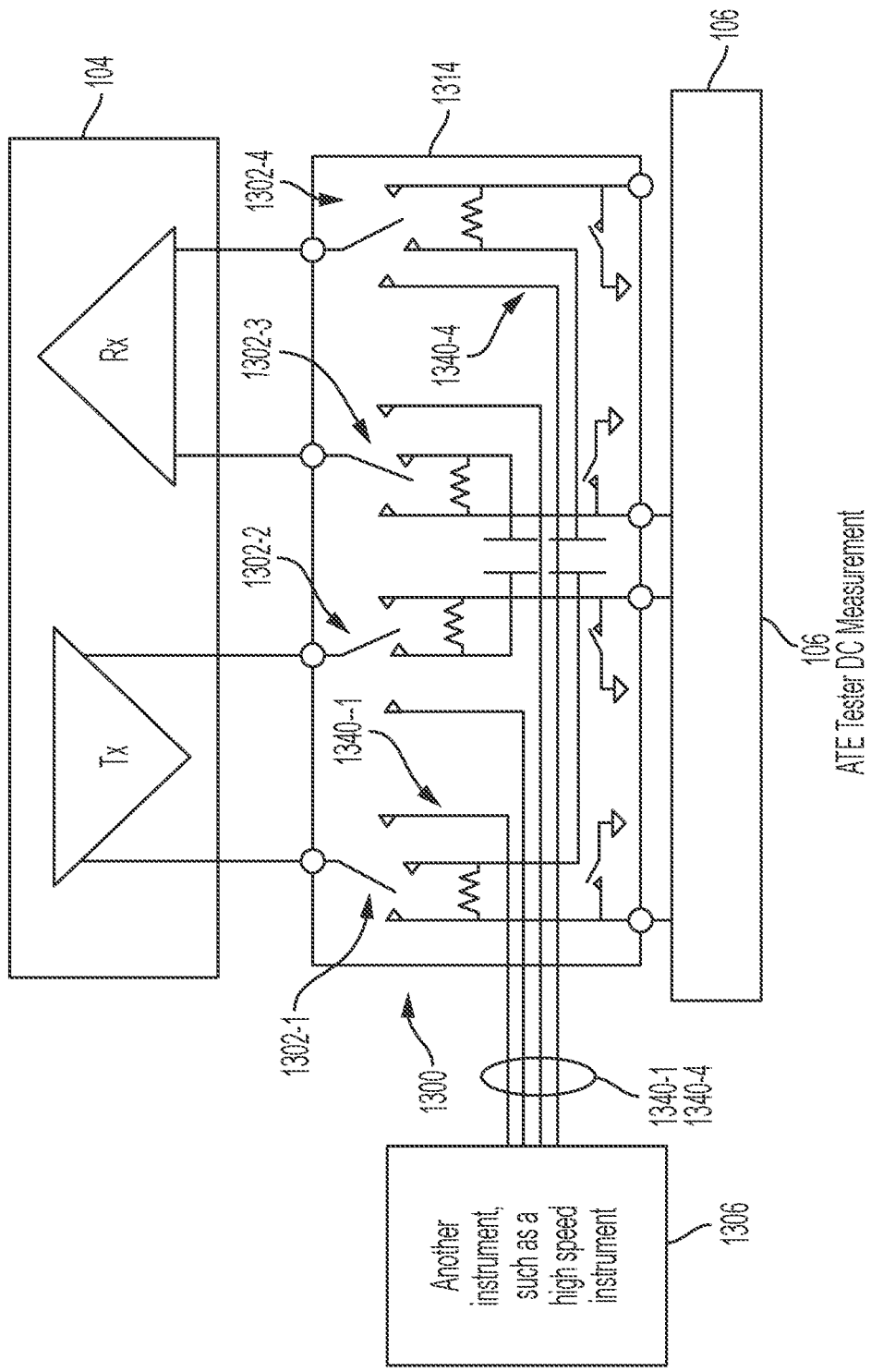
FIG. 13 is a schematic diagram of a MEMS switch block comprising a third throw configured to connect additional test instrument in a system such as that for testing the DUT, in accordance with some embodiments.
Figure 14:
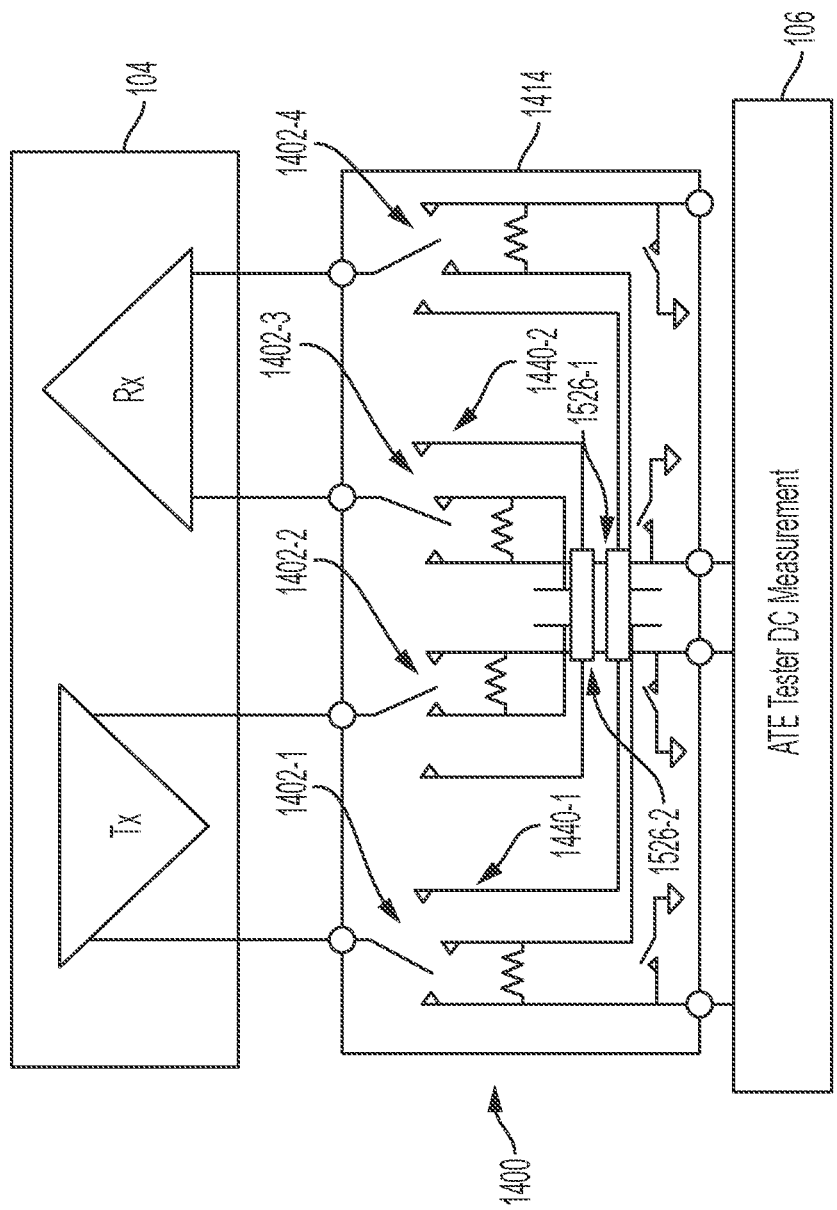
FIG. 14 shows a schematic diagram of a MEMS switch block comprising a third throw configured to connect a fault inducing RF path for use in a system such as that for testing a DUT, in accordance with some embodiments.
Figure 15:
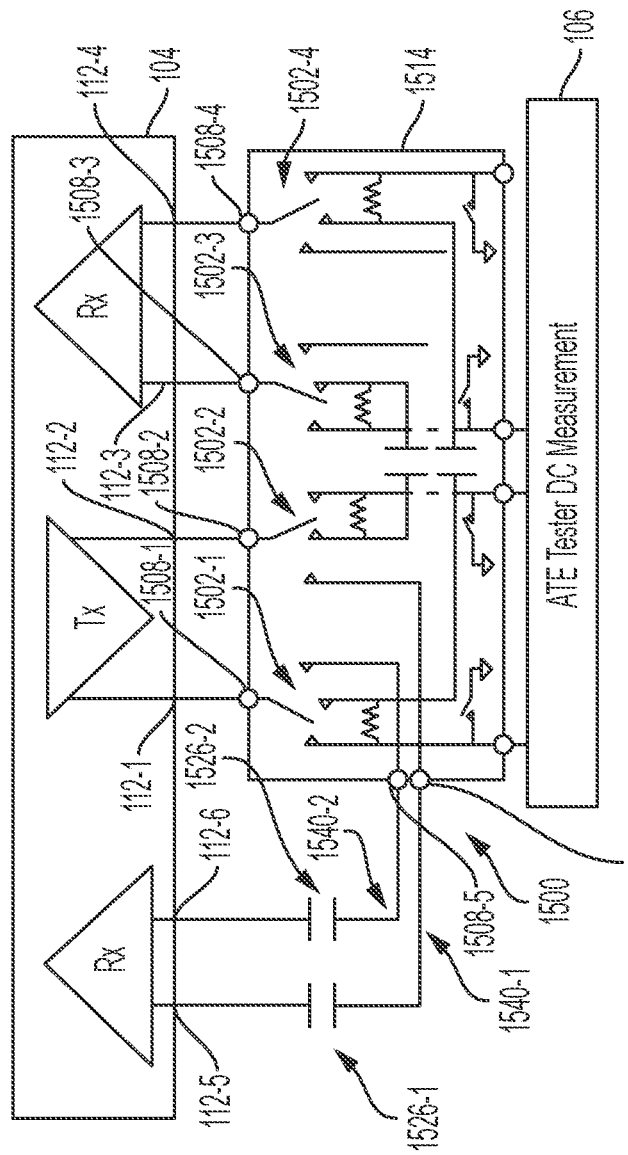
FIG. 15 shows a schematic diagram of a MEMS switch block comprising a third throw configured to connect test equipment to additional test pins of a DUT for use in a system such as that for testing the DUT, in accordance with some embodiments.

FIGS. 13-15 show various examples of MEMS switches that include a third throw, which may provide for various applications. For example, FIG. 13 is a schematic diagram of an apparatus 1300, in which each of the MEMS switches 1302-1 to 1302-4 comprises a third throw. Apparatus 1300 may be similar to apparatuses described previously in various embodiments. The third throws in the MEMS switches 1302-1 to 1302-4 allow the connection of signal lines 1340-1 to 1340-4 from respective Tx/Rx pins of the DUT 104 when the MEMS switches operate in a third state. These additional signal lines 1340-1 to 1340-4 may be configured to connect a second instrument 1306 to the DUT 104. For example, instrument 1306 may transmit data in a different speed measure (other than the signal on the RF path). Additionally and/or alternatively, instrument 1306 may also be another DC testing equipment.

FIG. 14 shows a schematic diagram of an apparatus 1400, in which each of the MEMS switches 1402-1 to 1402-4 comprises a third-throw. Apparatus 1400 may be similar to apparatuses described previously in various embodiments. The third throws in the MEMS switches 1402-1 to 1402-4 may be used to form signal lines (e.g., 1440-1, 1440-2) of an additional path 1440. For example, the additional path 1440 may be a fault inducing RF path that may be used in the semiconductor testing previously described or to perform additional testing. As shown in FIG. 14, each of the signal lines 1440-1 and 1440-2 of the additional RF path may include a circuit (e.g., 1526-1 or 1526-2). For example, circuits 1526-1/1526-2 may be a respective capacitor.

FIG. 15 shows a schematic diagram of an apparatus 1500, in which each of the MEMS switches 1502-1 to 1502-4 may comprise a third throw. Apparatus 1500 may be similar to apparatuses described previously in various embodiments. The third throws in the MEMS switches 1502-1 to 1502-4 may be used to enable a third path (e.g., 1540-1, 1540-2) to additional Tx/Rx pins of the DUT 104. For example, MEMS switch 1502-1 may be configured to, at a third state, connect a signal line 1540-2 of the third path that extends between a Tx/Rx pin 112-1 and Rx/Tx pin 112-6 of the DUT 104. Similarly, MEMS switch 1502-2 may be configured to, at the third state, connect a signal line 1540-1 of the third path that extends between a Tx/Rx pin 112-2 and Rx/Tx pin 112-5 of the DUT 104. As shown, each signal line of path 1540 may be extended between Tx/Rx pins of the DUT 104 through a respective additional terminal, such as 1508-5 and 1508-6. Similarly, each signal line of the third path 1540 may include a respective capacitor, e.g., 1526-1 and 1536-2. The third path 1540 may allow additional Tx/Rx pins of the DUT 104 to be tested. For example, path 1540 may be enabled for use in another testing, such as testing of more sensitive faulty pins. In implementation, path 1540 may include a mis-matched trace, a skew between differential signal lines, or a passive circuit.

Figure 16:
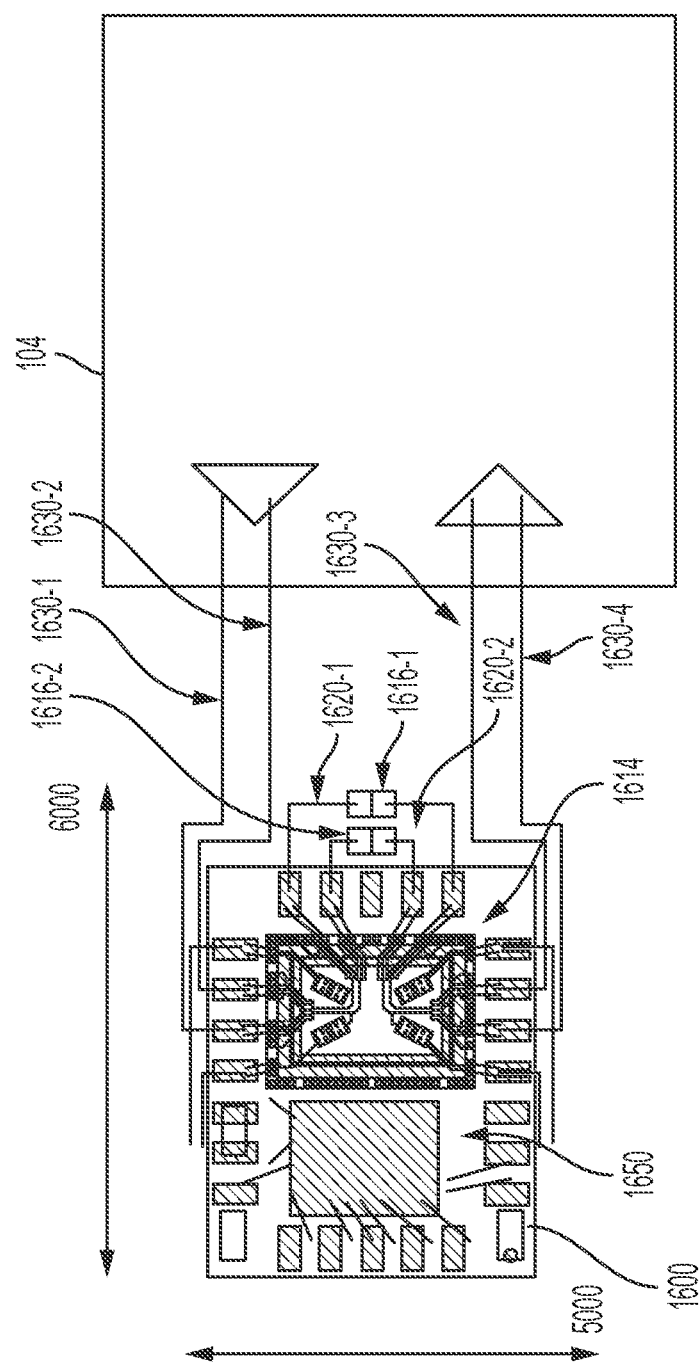
FIG. 16 is an example layout of a MEMS switch die and a controller disposed on a circuit board in a system such as that for testing a DUT, in accordance with some embodiments.

FIG. 16 is an example layout of a MEMS die and a controller disposed on a circuit board, in accordance with some embodiments. In some examples, any of the apparatuses described above in FIGS. 1-15 may be implemented on a die, e.g., a MEMS die 1614. The MEMS die 1614 may be disposed with a controller 1650 side by side on a circuit board 1600. As shown, multiple terminals of the apparatus in MEMS die 1614 may be coupled to corresponding contacts on the circuit board. In the configuration shown, the MEMS die 1614 implements the apparatus 200 (in FIG. 2B), which includes four SPST MEMS switches configured to enable/disable a DC path and an RF path. For example, as shown in FIG. 16, the signal lines 1630-1 to 1630-4 of the DC path may be formed between the DUT 104 and testing equipment (not shown) via various terminals of the MEMS die, where the various terminals are coupled to corresponding contacts on the circuit board. Further shown in FIG. 16, the two capacitors 1616-1 and 1616-2 may be coupled on respective signal lines 1620-1 and 1620-2 of the RF path, which may be formed between corresponding terminals of the MEMS die 1614 through contacts on the circuit board. In the example shown in FIG. 16, the MEMS switches in the MEM die may be operable in a high speed such as at a range at about 32 GHz/64 GBps.

Figure 17:
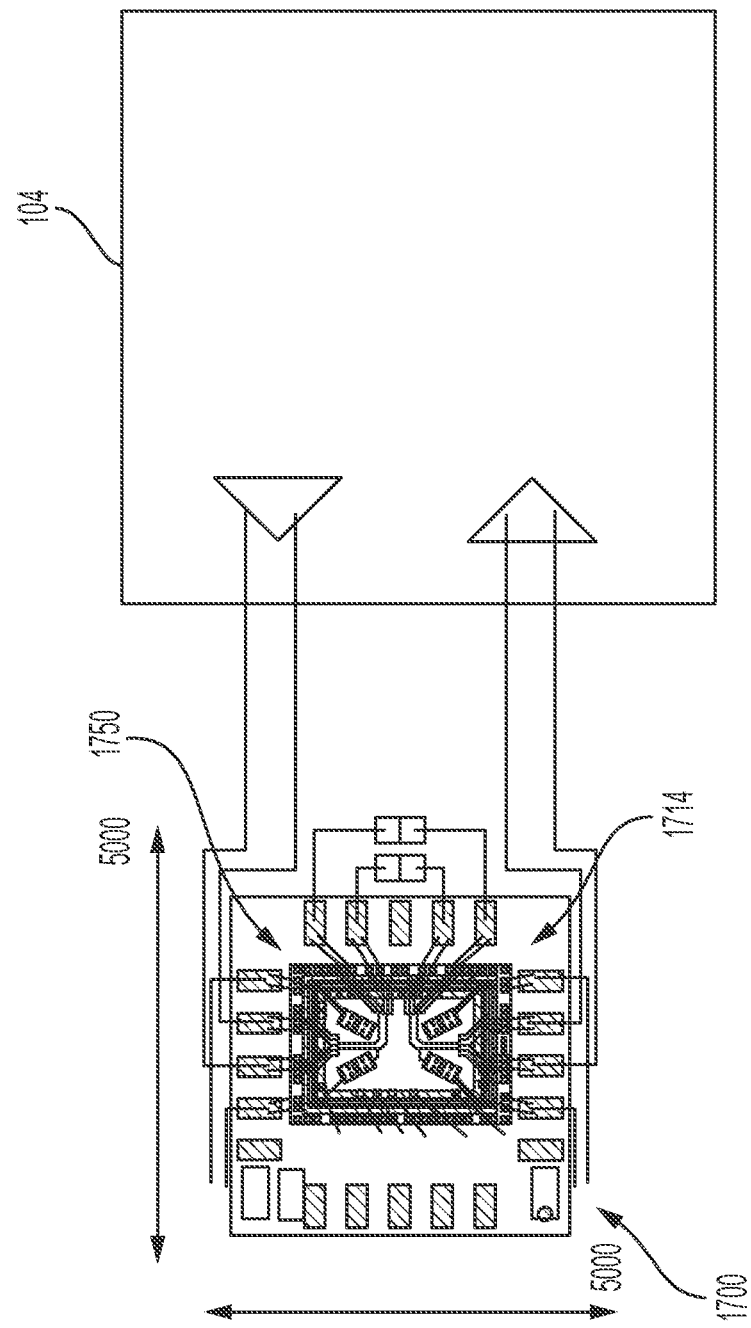
FIG. 17 is an example layout of a MEMS switch die and a controller stacked on the MEMS switch die in a system such as that for testing a DUT, in accordance with some embodiments.

FIG. 17 is a variation of the example layout of a MEMS die and a controller shown in FIG. 16, with a difference being that the MEMS die 1714 and the controller 1750 are stacked, and together are disposed on the circuit board 1700.

FIGS. 18A-18D show example pinouts of the MEMS switch dies of some configurations that result in different sizes of footprint in a system such as that for testing a DUT, in accordance with some embodiments. The MEMS dies may implement any suitable configuration of the apparatuses as previously described. For example, in FIG. 18A, apparatus 1800 includes four MEMS dies 1814-1 to 1814-4, each of which forms a respective signal line of the DC path extended from the DUE 104. Two inner MEMS dies, e.g., 1814-2 and 1814-3 may be disposed side by side to form a signal line of the RF path therein between, whereas two outer MEMS dies, e.g., 1814-1 and 1814-4 may be disposed along a longitudinal direction on opposite sides of the MEMS dies 1814-2 and 1814-3, to form another signal line of the RF path therein between. As shown, the signal lines of the DC path may extend from the MEMS dies in a lateral direction, whereas the signal lines of the RF path may extend in a longitudinal direction. Additionally, the two inner MEMS dies 1814-2/1814-3 and the two outer MEMS dies 1814-1/1814-4 may be arranged staggered in the lateral direction to save layout space.

Figure 18A:
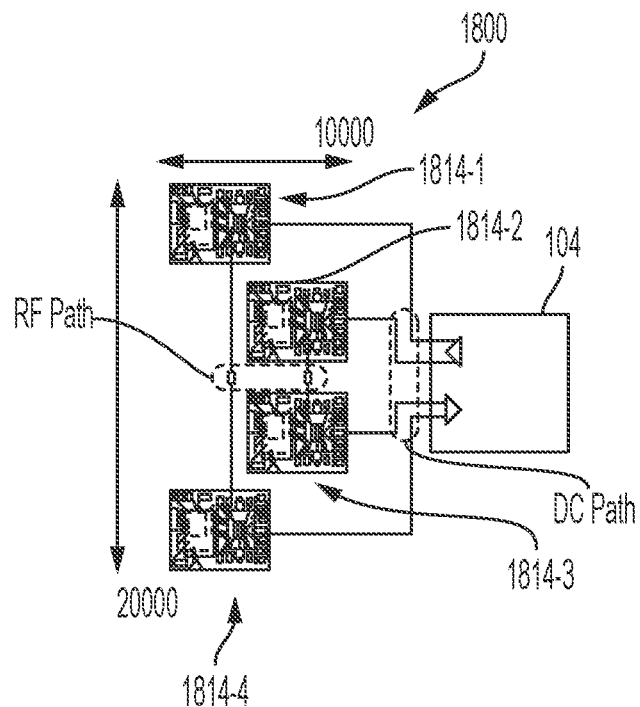
FIGS. 18A-18D show example pinouts of the MEMS switch dies of some configurations that result in different sizes of footprint in a system such as that for testing a DUT, in accordance with some embodiments.
Figure 18B:
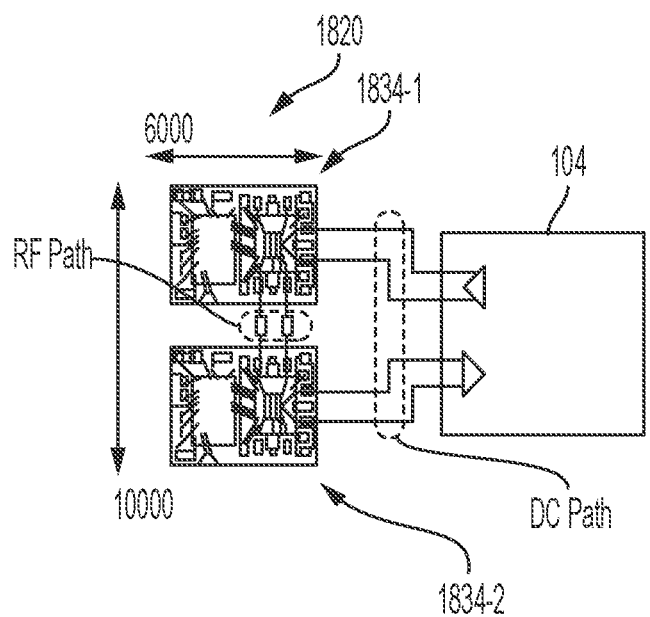
Figure 18C:
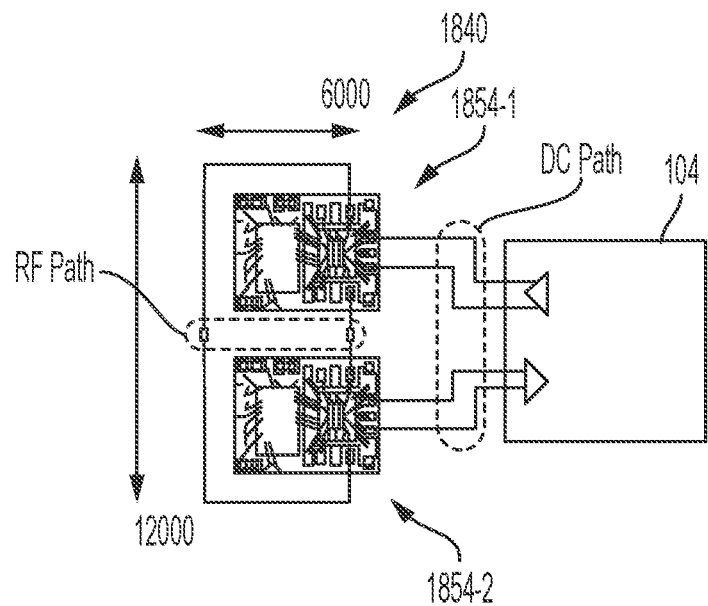
Figure 18D:
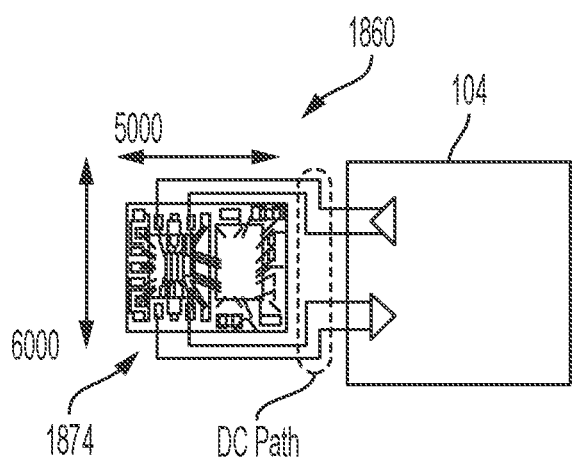

In FIG. 18B, apparatus 1820 includes two MEMS dies 1834-1 and 1834-2 disposed side by side. As shown, signal lines of the DC path may extend from the MEMS dies in a lateral direction to the DUT 104, wherein signal lines of the RF path may extend in a longitudinal direction in-between the two MEMS dies. In FIG. 18C, apparatus 1840 includes two MEMS dies 1854-1 and 1854-2 that are arranged in a similar manner as the two MEMS dies 1834-1 and 1834-2 are arranged, with a difference being that the signal lines of the RF path may each extend from opposite sides of the MEMS dies. FIG. 18D shows an apparatus 1860 that includes a single MEMS die 1874, where signal lines of the DC path extend from opposite sides of the MEMS die 1874, such as top and bottom sides of the MEMS die. Although FIGS. 18A-18D show variations of pinouts of MEMS die(s) that may implement apparatuses in various embodiments described in the present disclosure, it is appreciated that these variations of pinouts are not exhaustive, and other pinouts may also be possible.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, reference to a numerical value being between two endpoints should be understood to encompass the situation in which the numerical value can assume either of the endpoints. For example, stating that a characteristic has a value between A and B, or between approximately A and B, should be understood to mean that the indicated range is inclusive of the endpoints A and B unless otherwise noted.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

Various aspects are described in this disclosure. Some examples include the following, although the disclosure is not limited these aspects.

(1) An apparatus comprising: a plurality of first terminals configured to be coupled to respective pins on a semiconductor circuit under test; a plurality of second terminals configured to be coupled to a test equipment; and a plurality of microelectromechanical systems (MEMS) switches coupled to the plurality of first terminals and the plurality of second terminals, the plurality of MEMS switches are configured to: (A) operate in a first state to enable a direct current (DC) path between the semiconductor circuitry and the test equipment; and (B) operate in a second state to enable a radio frequency (RF) path between a transmitter pin and a receiver pin of the semiconductor circuit.

(2) The apparatus of aspect 1, further comprising a plurality of third terminals, wherein the RF path includes: (A) a first portion coupled between a first terminal of the plurality of first terminals and a second terminal of the plurality of third terminals to form a permanent electrical path between the first terminal and the second terminal; and (B) a second portion coupled between a third terminal of the plurality of first terminals and a fourth terminal of the plurality of third terminals to form a permanent electrical path between the third terminal and the fourth terminal.

(3) The apparatus of aspect 2, wherein the first terminal and the third terminal are configured to be respectively coupled to a transmitter (Tx)/receiver (Rx) pin and an Rx/Tx pin of the semiconductor device so that the first portion and the second portion of the RF path form a first signal line of the RF path between the Tx/Rx pin and the Rx/Tx pin of the semiconductor device.

(4) The apparatus of aspect 3, wherein the first signal line includes a capacitor coupled between the second terminal and the fourth terminal.

(5) The apparatus of aspect 3, further comprising: a first MEMS switch coupled between the first terminal and a fifth terminal of the plurality of second terminals, wherein the first MEMS switch is configured to connect/disconnect a first signal line of the DC path from the Tx/Rx pin of the semiconductor device to the test equipment; and a second MEMS switch coupled between the third terminal and a sixth terminal of the plurality of second terminals, wherein the second MEMS switch is configured to connect/disconnect a second signal line of the DC path from the Rx/Tx pin of the semiconductor device to the test equipment.

(6) The apparatus of aspect 5, wherein the first and second MEMS switches are formed in a single MEMS switch block.

(7) The apparatus of aspect 5, wherein the first MEMS switch is formed in a first MEMS switch block and the second MEMS switch is formed in a second MEMS switch block.

(8) The apparatus of aspect 1, wherein the plurality of MEMS switches are configured to: disable the RF path in the first state; and disable the DC path in the second state.

(9) The apparatus of aspect 8, further comprising a plurality of third terminals, wherein the plurality of MEMS switches comprise: (A) a first MEMS switch coupled to a first terminal of the plurality of first terminals and a second terminal of the plurality of third terminals, and configured to connect/disconnect a first signal line of the RF path; and (B) a second MEMS switch coupled to a third terminal of the plurality of first terminals and a fourth terminal of the plurality of third terminals, and configured to connect/disconnect the first signal line of the RF path; wherein the first terminal and the third terminal are configured to be respectively coupled to a Tx pin and an Rx pin of the semiconductor device so that the first signal line of the RF path, when connected, extends between the Tx pin and the Rx pin of the semiconductor device and through the first MEMS switch and the second MEMS switch.

(10) The apparatus of aspect 9, wherein the plurality of MEMS switches further comprise: (A) a third MEMS switch coupled to the first terminal and a fifth terminal of the plurality of second terminals, and configured to connect/ disconnect a first signal line of the DC path; and (B) a fourth MEMS switch coupled to the third terminal and a sixth terminal of the plurality of second terminals, and configured to connect/disconnect a second signal line of the DC path; wherein the first signal line and the second signal line of the DC path, when connected, respectively extend between the Tx and Rx pins to the test equipment.

(11) The apparatus of aspect 8, further comprising a plurality of third terminals, wherein the plurality of MEMS switches comprise: (A) a first MEMS switch coupled to a first terminal of the plurality of first terminals, a second terminal of the plurality of second terminals, and a third terminal of the plurality of third terminals, wherein the first MEMS switch is configured to: (A1) in the first state, connect a first signal line of the DC path from the semiconductor device to the test equipment through the first terminal and the second terminal; and (A2) in the second state, connect a first signal line of the RF path between the first terminal and the third terminal; and (B) a second MEMS switch coupled to a fourth terminal of the plurality of first terminals, a fifth terminal of the plurality of second terminals, and a sixth terminal of the plurality of third terminals, wherein the second MEMS switch is configured to: (B1) in the first state, connect a second signal line of the DC path from the semiconductor device to the test equipment through the fourth terminal and the fifth terminals; and (B2) in the second state, connect the first signal line of the RF path between the fourth and sixth terminals; wherein the first signal line of the RF path, when connected, extends between a Tx pin and an Rx pin of the semiconductor device.

(12) The apparatus of aspect 11, further comprising a capacitor coupled to the third terminal and the sixth terminal along the first signal line of the RF path.

(13) The apparatus of aspect 11, wherein each of the first and second MEMS switches is a SPDT switch.

(14) The apparatus aspect 11, wherein each of the first and second MEMS switches is a teeter-totter switch, wherein: an input node of the first MEMS switch is coupled to the first terminal; a second node and a third node of the first MEMS switch are each coupled respectively to the second terminal and the third terminal; an input node of the second MEMS switch is coupled to the fourth terminal; a second node and a third node of the second MEMS switch are each coupled respectively to the fifth terminal and the sixth terminal.

(15) The apparatus aspect 11, wherein the first MEMS switch is formed in a first MEMS switch block and the second MEMS switch is formed in a second MEMS switch block.

(16) The apparatus of aspect 1, wherein a signal line of the RF path is formed inside a MEMS switch block and coupled between a first terminal of the plurality of first terminals and a second terminal of the plurality of first terminals.

(17) The apparatus of aspect 16, further comprising a capacitor coupled between the first terminal and the second terminal along the signal line of the RF path, the capacitor also being formed in the MEMS switch block.

(18) The apparatus of aspect 16, wherein the first terminal and the second terminal are configured to be respectively coupled to a transmitter (Tx)/receiver (Rx) pin and an Rx/Tx pin of the semiconductor device to form a first signal line of the RF path between the Tx/Rx pin and the Rx/Tx pin of the semiconductor device through the first terminal and the second terminal.

(19) The apparatus of aspect 16, further comprising: (A) a first MEMS switch formed in the MEMS switch block, the first MEMS switch is coupled between the first terminal and a third terminal of the plurality of second terminals, wherein the first MEMS switch is configured to connect/disconnect a first signal line of the DC path from a transmitter (Tx)/receiver (Rx) pin of the semiconductor device to the test equipment; and (B) a second MEMS switch formed in the MEMS switch block, the second MEMS switch is coupled between the second terminal and a fourth terminal of the plurality of second terminals, wherein the second MEMS switch is configured to connect/disconnect a second signal line of the DC path from an Rx/Tx pin of the semiconductor device to the test equipment.

(20) The apparatus of aspect 1, wherein the plurality of MEMS switches are formed in a MEMS switch block, the plurality of MEMS switches comprise: (A) a first MEMS switch coupled to a first terminal of the plurality of first terminals, a second terminal of the plurality of second terminals, and a first node of a first signal line of the RF path, wherein the first MEMS switch is configured to: (A1) in the first state, connect a first signal line of the DC path from the semiconductor device to the test equipment through the first and second terminals; and (A2) in the second state, connect the first signal line of the RF path through the first terminal and the first node; and (B) a second MEMS switch coupled to a third terminal of the plurality of first terminals, a fourth terminal of the plurality of second terminals, and a second node of the RF path, wherein the second MEMS switch is configured to: (B1) in the first state, connect a second signal line of the DC path from the semiconductor device to the test equipment through the third and fourth terminals; and (B2) in the second state, connect the first signal line of the RF path through the third terminal and the second node; wherein the RF path is formed in the MEMS switch block.

(21) The apparatus of aspect 20, wherein the first terminal and the third terminal are configured to be respectively coupled to a transmitter (Tx)/receiver (Rx) pin and an Rx/Tx pin of the semiconductor device so that the first signal line of the RF path extends between the/Rx pin and the Rx/Tx pin of the semiconductor device, when the first and second MEMS switches operate in the second state.

(22) The apparatus of aspect 1, wherein the plurality of MEMS switches are configured to enable a third path in a third state.

(23) The apparatus of aspect 22, wherein the plurality of MEMS switches comprise: (A) a first MEMS switch coupled to a first terminal of the plurality of first terminals, a second terminal of the plurality of second terminals, a first node of the RF path, and a second node of the third path, wherein the first MEMS switch is configured to: (A1) in the first state, connect a first signal line of the DC path from the semiconductor device to the test equipment through the first and second terminals; (A2) in the second state, enable the RF path through the first terminal and the first node of the RF path; and (A3) in the third state, enable the third path through the first terminal and the second node; and (B) a second MEMS switch coupled to a third terminal of the plurality of first terminals, a fourth terminal of the plurality of second terminals, a third node of the RF path, and a fourth node of the third path, wherein the second MEMS switch is configured to: (B1) in the first state, connect a second signal line of the DC path from the semiconductor device to the test equipment through the third and fourth terminals; (B2) in the second state, enable the RF path through the second terminal and the third node of the RF path; and (B3) in the third state, enable the third path through the second terminal and the fourth node.

(24) The apparatus of aspect 23, further comprising a plurality of third terminals configured to be coupled to another test equipment, wherein the third path is configured to, when connected, connect the semiconductor device to the another test equipment.

(25) The apparatus of aspect 24, wherein the another test equipment is a high-speed instrument capable of performing an RF test.

(26) The apparatus of aspect 23, wherein the third path forms a first signal line of an alternative RF path.

(27) The apparatus of aspect 26, wherein the plurality of MEMS switches further comprise: a third MEMS switch and a fourth MEMS switch, the third and fourth MEMS switches configured to connect a second signal line of the alternative RF path.

(28) The apparatus of aspect 27, wherein each of the first signal line and the second signal line of the alternative RF path comprises a respective circuit.

(29) The apparatus of aspect 22, wherein the plurality of MEMS switches comprise: (A) a first MEMS switch coupled to a first terminal of the plurality of first terminals, a second terminal of the plurality of second terminals, a first node of the RF path, and a second node of the third path, wherein the first MEMS switch is configured to: (A1) in the first state, connect a first signal line of the DC path from the semiconductor device to the test equipment through the first and second terminals; (A2) in the second state, enable the RF path through the first terminal and the first node of the RF path; and (A3) in the third state, enable the third path through the first terminal and the second node; and (B) a second MEMS switch coupled to a third terminal of the plurality of first terminals, a fourth terminal of the plurality of second terminals, a third node of the RF path, wherein the second MEMS switch is configured to: (B1) in the first state, connect a second signal line of the DC path from the semiconductor device to the Test equipment through the third and fourth terminals; (B2) in the second state, enable the RF path through the second terminal and the third node of the RF path; and (B3) in the third state, disconnect the second signal line of the DC path and the RF path.

(30) The apparatus of aspect 29, wherein the first terminal is configured to be coupled to a first transmitter (Tx) pin of the semiconductor device and the third terminal is configured to be coupled to a first receiver (Rx) pin of the semiconductor device so that the RF path, when connected, forms a loopback between the first Tx pin and the first Rx pin of the semiconductor device.

(31) The apparatus of aspect 30, further comprising a plurality of third terminals configured to be coupled to the semiconductor device, wherein the second node of the third path is coupled to a fifth terminal of the plurality of third terminals, the fifth terminal is configured to: (A) be coupled to a second Rx pin of the semiconductor device so that the third path, when connected, forms a loopback between the first Tx pin and the second Rx pin of the semiconductor device; or (B) be coupled to a second Tx pin of the semiconductor device so that the third path, when connected, forms a loopback between the second Tx pin and the first Rx pin of the semiconductor device.

(32) The apparatus of aspect 1, wherein one or more of the plurality of MEMS switches each includes a plurality of bumped contacts, the bumped contacts are configured to be in electrical contact with a circuit board to connect a respective signal line of the DC path and/or the RF path to the circuit board.

(33) The apparatus of aspect 1, further comprising one or more bleeding circuits respectively coupled to one or more MEMS switches of the plurality of MEMS switches in parallel, wherein the one or more bleeding circuits each is configured to prevent a charge buildup at a node of a respective MEMS switch coupled thereto, when the respective MEMS switch switches from the first state to the second state.

(34) The apparatus of aspect 1, further comprising one or more shunt circuits respectively coupled to one or more MEMS switches of the plurality of MEMS switches, wherein the one or more shunt circuits are each configured to short a node of a respective MEMS switch coupled thereto to a ground to isolate the RF path from the DC path, when the respective MEMS switches from the first state to the second state.

(35) The apparatus of aspect 1, wherein the plurality of MEMS switches are formed in a MEMS die.

(36) The apparatus of aspect 35, further comprising a controller coupled to the MEMS die, wherein the controller is configured to control operations of the plurality of MEMS switches in the MEMS die.

(37) The apparatus of aspect 36, wherein the controller and the MEMS die are disposed side by side on a circuit board.

(38) The apparatus of aspect 36, wherein the controller and the MEMS die are stacked and disposed on a circuit board together.

(39) A method for performing testing on a semiconductor circuitry using an apparatus of any of aspects 1-38, the method comprising: controlling the plurality of MEMS switches to operate in the first state to enable the DC path; when the DC path is enabled, performing a DC test on the semiconductor circuitry using the DC path; controlling the plurality of MEMS switches to operate in the second state to enable the RF path; and when the RF path is enabled, performing an RF test on the semiconductor circuitry using the RF path.

What is claimed is:

1. An apparatus comprising:
    a plurality of first terminals configured to be coupled to a semiconductor circuit under test;
    a plurality of second terminals configured to be coupled to a test equipment; and
    a plurality of microelectromechanical systems (MEMS) switches coupled to the plurality of first terminals, wherein the plurality of MEMS switches are configured to:
        operate in a first state to enable a direct current (DC) path between the semiconductor circuit and the test equipment; and
        operate in a second state to enable a radio frequency (RF) path;
    wherein the plurality of MEMS switches comprise:
        a first MEMS switch coupled to a first terminal of the plurality of first terminals and configured to connect or disconnect a first signal line of the RF path; and
        a second MEMS switch coupled to a second terminal of the plurality of first terminals and configured to connect or disconnect the first signal line of the RF path;
            wherein the first terminal and the second terminal are configured to be respectively coupled to a transmitter (Tx) pin and a receiver (Rx) pin of the semiconductor circuit so that the first signal line of the RF path, when connected, extends between the Tx pin and the Rx pin of the semiconductor circuit and through the first MEMS switch and the second MEMS switch.

2. The apparatus of claim 1, wherein the plurality of MEMS switches are further configured to:

disable the RF path in the first state; and
disable the DC path in the second state.

3. The apparatus of claim 2, further comprising a plurality of third terminals, wherein:
the first MEMS switch is coupled to a third terminal of the plurality of third terminals; and
the second MEMS switch is coupled to a fourth terminal of the plurality of third terminals.

4. The apparatus of claim 3, wherein:
the first MEMS switch and the second MEMS switch are configured to disconnect the first signal line of the RF path in the first state and connect the first signal line of the RF path in the second state.

5. The apparatus of claim 4, wherein the first signal line of the RF path comprises a portion extending from the third terminal to the fourth terminal.

6. The apparatus of claim 5, further comprising a capacitor coupled to the third terminal and the fourth terminal along the portion of the first signal line of the RF path.

7. The apparatus of claim 3, wherein the plurality of MEMS switches further comprise:
a third MEMS switch coupled to the first terminal and a fifth terminal of the plurality of second terminals, and configured to connect or disconnect a first signal line of the DC path; and
a fourth MEMS switch coupled to the second terminal and a sixth terminal of the plurality of second terminals, and configured to connect or disconnect a second signal line of the DC path;
wherein the first signal line and the second signal line of the DC path, when connected, respectively extend between the Tx and Rx pins to the test equipment.

8. The apparatus of claim 7, wherein:
the third MEMS switch is configured to connect the first signal line of the DC path in the first state and disconnect the first signal line of the DC path in the second state; and
the fourth MEMS switch is configured to connect the second signal line of the DC path in the first state and disconnect the second signal line of the DC path in the second state.

9. The apparatus of claim 8, wherein:
each of the first and second MEMS switches is a single-pole-single-throw (SPST) switch operable at a first speed; and
each of the third and fourth MEMS switches is a SPST switch operable at a second speed higher than the first speed.

10. The apparatus of claim 1, further comprising one or more bleeding circuits respectively coupled to one or more MEMS switches of the plurality of MEMS switches in parallel, wherein the one or more bleeding circuits each is configured to prevent a charge buildup at a node of a respective MEMS switch coupled thereto, when the respective MEMS switch switches from the first state to the second state.

11. The apparatus of claim 1, further comprising one or more shunt circuits respectively coupled to one or more MEMS switches of the plurality of MEMS switches, wherein the one or more shunt circuits are each configured to short a node of a respective MEMS switch coupled thereto to a ground to isolate the RF path from the DC path, when the respective MEMS switches from the first state to the second state.

12. The apparatus of claim 1, wherein the plurality of MEMS switches are formed in a MEMS die.

13. The apparatus of claim 12, further comprising a controller coupled to the MEMS die, wherein the controller is configured to control operations of the plurality of MEMS switches in the MEMS die.

14. The apparatus of claim 13, wherein the controller and the MEMS die are disposed side by side or stacked together on a circuit board.

15. A method for performing testing on a semiconductor circuitry using an apparatus coupled between the semiconductor circuitry and testing equipment, the method comprising:
controlling a plurality of microelectromechanical systems (MEMS) switches of the apparatus to operate in a first state to enable a direct current (DC) path between the semiconductor circuitry and the testing equipment;
when the DC path is enabled, performing a direct current (DC) test on the semiconductor circuitry using the DC path;
controlling the plurality of MEMS switches to operate in a second state to enable a radio frequency (RF) path; and
when the RF path is enabled, performing a radio frequency (RF) test on the semiconductor circuitry using the RF path;
wherein the plurality of MEMS switches comprise:
a first MEMS switch coupled to a first terminal of a plurality of first terminals configured to be coupled to the semiconductor circuitry and configured to connect or disconnect a first signal line of the RF path; and
a second MEMS switch coupled to a second terminal of the plurality of first terminals and configured to connect or disconnect the first signal line of the RF path;
wherein the first terminal and the second terminal are configured to be respectively coupled to a a transmitter (Tx) pin and a receiver Rx pin of the semiconductor circuitry so that the first signal line of the RF path, when connected, extends between the Tx pin and the Rx pin of the semiconductor circuitry and through the first MEMS switch and the second MEMS switch.

16. The method of claim 15, further comprising:
controlling one or more bleeding circuits each coupled to a respective MEMS switch of the plurality of MEMS switches to prevent a charge buildup at a node of the respective MEMS switch coupled thereto, when the respective MEMS switch switches from the first state to the second state.

17. The method of claim 15, further comprising:
controlling one or more shunt circuits each coupled to a node of a respective MEMS switch of the plurality of MEMS switches to short the node to ground to isolate the RF path from the DC path, when the respective MEMS switches from the first state to the second state.

18. An apparatus comprising:
a microelectromechanical systems (MEMS) switch block comprising:
a plurality of common terminals configured to be respectively coupled to a plurality of test pins of a semiconductor circuit;
a plurality of first terminals configured to be coupled to a direct current (DC) test equipment;
a plurality of second terminals;
a plurality of first MEMS switches each configured to be coupled to a respective one of the plurality of common terminals and a respective one of the plurality of first terminals to connect or disconnect a respective DC signal line from a respective test pin of the semiconductor circuit to the test equipment; and a plurality of second MEMS switches each configured to be coupled to a respective one of the plurality of common terminals and a respective one of the plurality of second terminals, wherein a first MEMS switch and a second MEMS switch of the plurality of second MEMS switches are configured to connect or disconnect a radio frequency (RF) signal line between a first test pin and a second test pin of the semiconductor circuit;

wherein the MEMS switch block is configured to:

operate in a first state, wherein each of the plurality of first MEMS switches is configured to connect the respective DC signal line from the respective test pin of the semiconductor circuit to the test equipment, and wherein the first MEMS switch and the second MEMS switch of the plurality of second MEMS switches are configured to disconnect the RF signal line between the first test pin and the second test pin of the semiconductor circuit; and operate in a second state, wherein each of the plurality of first MEMS switches is configured to disconnect the respective DC signal line from the respective test pin of the semiconductor circuit to the test equipment, and wherein the first MEMS switch and the second MEMS switch of the plurality of second MEMS switches are configured to connect the RF signal line between the first test pin and the second test pin of the semiconductor circuit;

wherein each of the plurality of test pins of the semiconductor circuit is a transmitter (Tx) pin or a receiver (Rx) pin such that:

when the MEMS switch block operates in the first state, the DC signal lines connected respectively by each of the plurality of first MEMS switches facilitate a DC contact test for the plurality of test pins of the semiconductor circuit; and when the MEMS switch block operates in the second state, the RF signal line facilitates RF loopback path to enable RF test for the semiconductor circuit.

19. The apparatus of claim 18, wherein:

a third MEMS switch and a fourth MEMS switch of the plurality of second MEMS switches are configured to connect or disconnect another RF signal line between a third test pin and a fourth test pin of the semiconductor circuit;

when the MEMS switch block operates in the first state, the third MEMS switch and the fourth MEMS switch of the plurality of second MEMS switches are configured to disconnect the another RF signal line between the third test pin and the fourth test pin of the semiconductor circuit; and when the MEMS switch block operates in the second state, the third MEMS switch and the fourth MEMS switch of the plurality of second MEMS switches are configured to connect the another RF signal line between the third test pin and the fourth test pin of the semiconductor circuit.

\* \* \* \* \*